(12) United States Patent
Kondo et al.

(10) Patent No.: US 12,527,030 B2
(45) Date of Patent: Jan. 13, 2026

(54) NITRIDE SEMICONDUCTOR DEVICE

(71) Applicant: FUJI ELECTRIC CO., LTD., Kawasaki (JP)

(72) Inventors: Tsurugi Kondo, Hachioji (JP); Katsunori Ueno, Matsumoto (JP); Shinya Takashima, Hachioji (JP); Ryo Tanaka, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 509 days.

(21) Appl. No.: 18/180,353

(22) Filed: Mar. 8, 2023

(65) Prior Publication Data

US 2023/0387292 A1   Nov. 30, 2023

(30) Foreign Application Priority Data

May 30, 2022   (JP) ................................ 2022-087960

(51) Int. Cl.
| | |
|---|---|
| *H01L 29/78* | (2006.01) |
| *H10D 30/66* | (2025.01) |
| *H10D 62/17* | (2025.01) |
| *H10D 62/85* | (2025.01) |

(52) U.S. Cl.
CPC ......... *H10D 30/668* (2025.01); *H10D 62/393* (2025.01); *H10D 62/8503* (2025.01)

(58) Field of Classification Search
None
See application file for complete search history.

(56) References Cited

U.S. PATENT DOCUMENTS

| | | |
|---|---|---|
| 10,644,147 B2 | 5/2020 | Ueno |
| 10,903,352 B2 | 1/2021 | Takashima et al. |
| (Continued) | | |

FOREIGN PATENT DOCUMENTS

| | | |
|---|---|---|
| JP | 2018-125441 A | 8/2018 |
| JP | 2019-096744 A | 6/2019 |
| (Continued) | | |

OTHER PUBLICATIONS

NPL1 (The 82nd JSAP Autumn Meeting, Speech Proceedings 23a-P10-11) NPL 1 describes that at GaN/SiO2 interfaces, interface levels will be formed that can become hole traps due to Ga—O ponding. NPL1 is discussed in the description of the Specification.
(Continued)

*Primary Examiner* — William C Trapanese

(57) ABSTRACT

A nitride semiconductor device including: a gallium nitride substrate; and a vertical MOSFET provided on the gallium nitride substrate, the vertical MOSFET including:
an N-type drift region provided in the gallium nitride substrate; a P-type well region provided in the drift region; an N-type source region provided in the well region; a gate insulating film provided on a surface of the well region; and a gate electrode provided on the surface of the well region via the gate insulating film, wherein the well region includes a first well region and a second well region higher in acceptor element concentration than the first well region, the second well region being located between the first well region and the gate insulating film and being in contact with the source region.

14 Claims, 31 Drawing Sheets

(56) References Cited

U.S. PATENT DOCUMENTS

| 2014/0210008 A1* | 7/2014 | Oritsuki | H10D 30/0291 |
| | | | 438/237 |
| 2019/0157448 A1 | 5/2019 | Takashima et al. | |
| 2019/0267486 A1 | 8/2019 | Ueno | |

FOREIGN PATENT DOCUMENTS

| JP | 2019-149496 A | 9/2019 |
| JP | 2020-057636 A | 4/2020 |

OTHER PUBLICATIONS

NPL2 (The 82nd JSAP Autumn Meeting, Speech Proceedings 12p-N305-5) NPL2 describes that in MOS capacitors, there are less hole traps between high-concentration P-type GaN and an oxide film. NPL2 is discussed in the description of the Specification.

* cited by examiner

FIG. 26
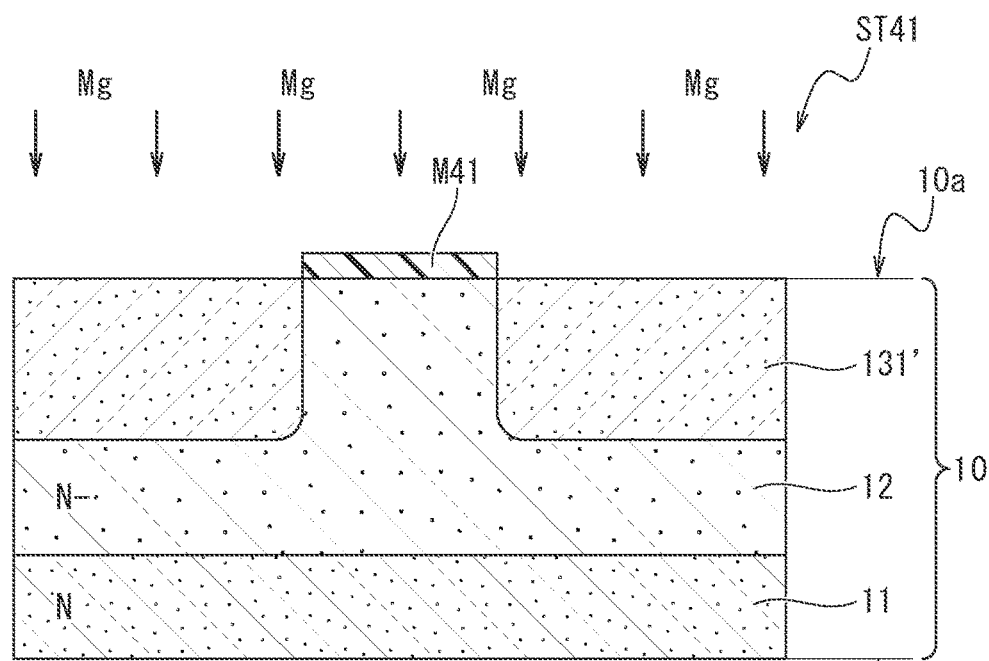
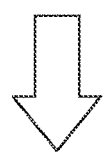
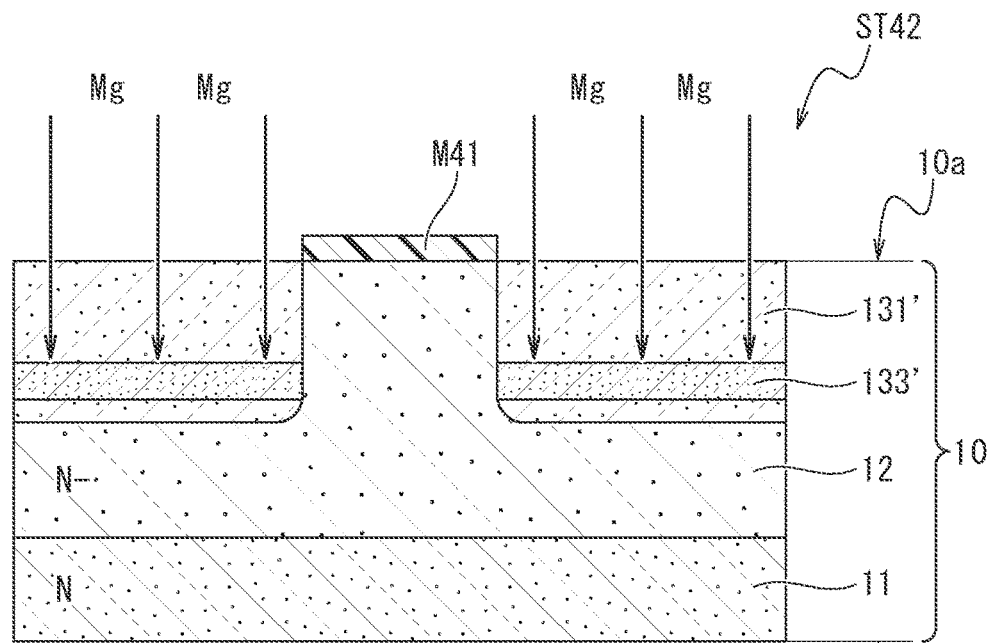
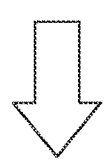

FIG. 27
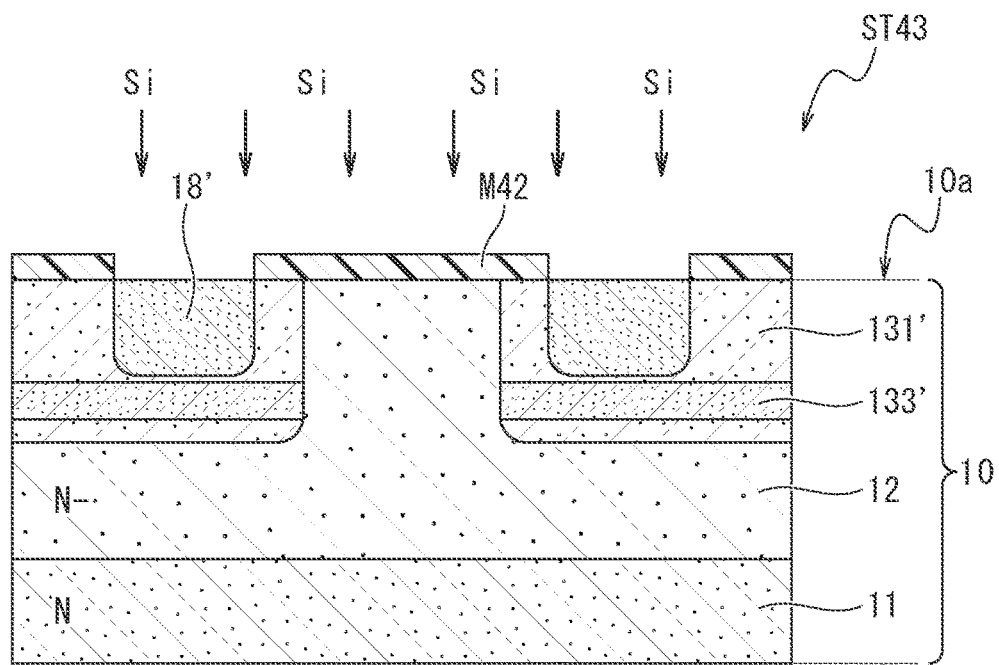
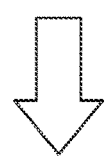
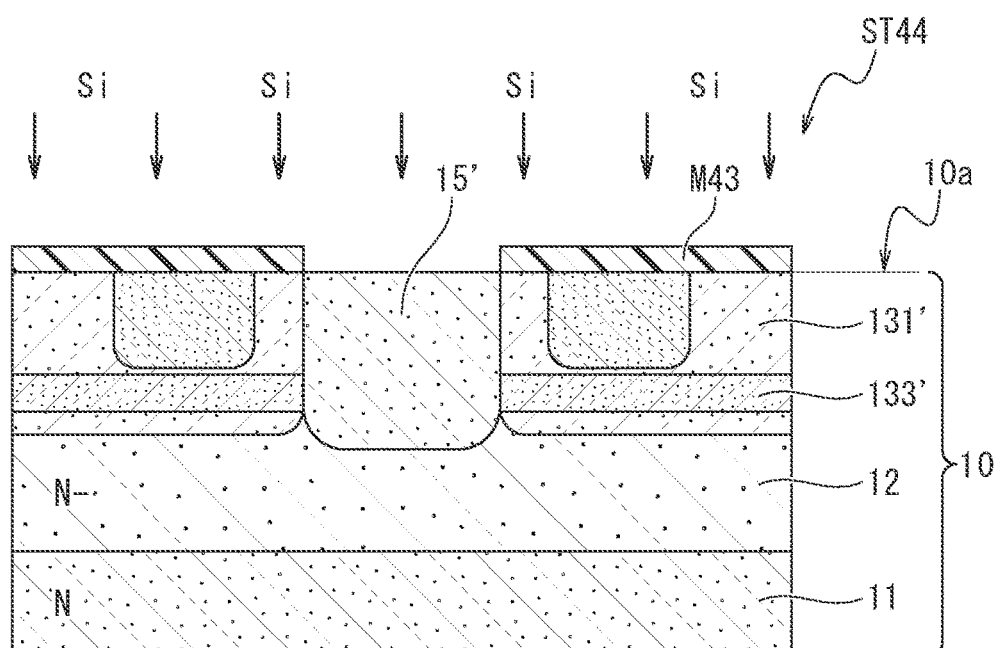
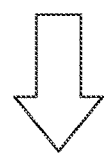

FIG. 31
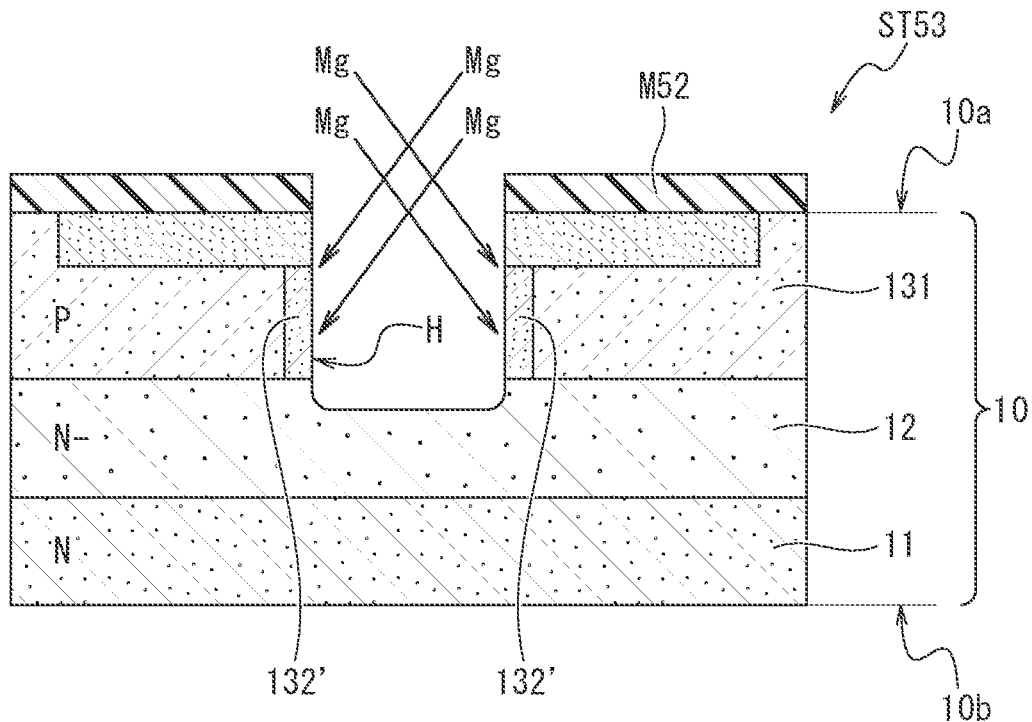
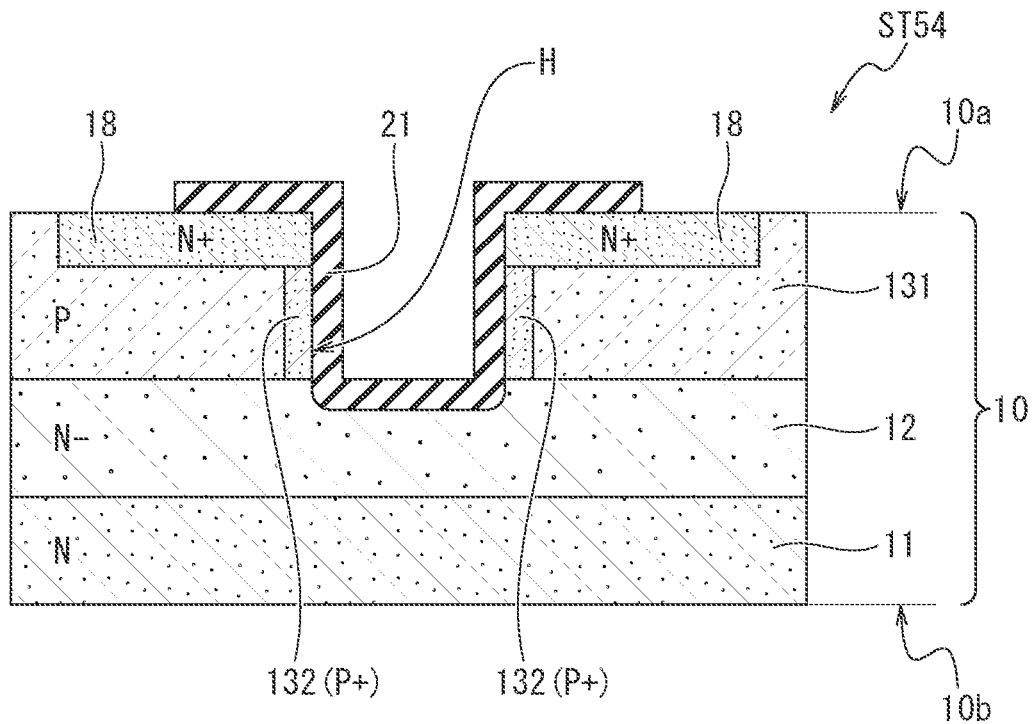

NITRIDE SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2022-087960 filed on May 30, 2022, the entire contents of which are incorporated by reference herein.

TECHNICAL FIELD

The present disclosure relates to a nitride semiconductor device.

BACKGROUND ART

Nitride semiconductor devices having a vertical metal oxide semiconductor (MOS) structure are known (see, for example, PTL 1). There is also a prediction that at $GaN/SiO_2$ interfaces, interface levels will be formed that can become hole traps due to Ga—O bonding (see, for example, NPL 1). In a MOS transistor in which a channel is formed at a $GaN/SiO_2$ interface, hole traps at the $GaN/SiO_2$ interface can cause fluctuations in electrical characteristics of the MOS transistor, and therefore are desirably reduced.

In addition, it has been reported that in MOS capacitors, there are less hole traps between high-concentration P-type GaN and an oxide film (see, for example, NPL 2).

CITATION LIST

Patent Literature
  PTL 1: JP 2019-096744 A
Non Patent Literature
  NPL 1: The 82nd JSAP (The Japan Society of Applied Physics) Autumn Meeting, Speech Proceedings 23a-P10-11
  NPL 2: The 82nd JSAP Autumn Meeting, Speech Proceedings 12p-N305-5

SUMMARY OF INVENTION

Technical Problem

When the structure of the MOS capacitor (high-concentration P-type GaN/oxide film) reported in NPL 1 is applied as it is to a vertical MOS transistor, threshold voltage of the vertical MOS transistor becomes higher than necessary, which can result in deteriorated electrical characteristics, such as an increased switching loss.

The present disclosure has been made in view of such circumstances, and it is an object of the present disclosure to provide a nitride semiconductor device capable of reducing hole traps while suppressing deterioration in the electrical characteristics of a vertical MOSFET.

Solution to Problem

In order to achieve the above-described object, according to an aspect of the present disclosure, there is provided a nitride semiconductor device including: a gallium nitride substrate; and a vertical MOSFET provided on the gallium nitride substrate, the vertical MOSFET including: an N-type drift region provided in the gallium nitride substrate; a P-type well region provided in the drift region; an N-type source region provided in the well region; a gate insulating film provided on a surface of the well region; and a gate electrode provided on the surface of the well region via the gate insulating film, wherein the well region includes a first well region and a second well region higher in acceptor element concentration than the first well region, the second well region being located between the first well region and the gate insulating film and being in contact with the source region.

Advantageous Effects of Invention

According to the present disclosure, it is possible to provide a nitride semiconductor device capable of reducing hole traps while suppressing deterioration in the electrical characteristics of a vertical MOSFET.

BRIEF DESCRIPTION OF DRAWINGS

FIG. 26 is a cross-sectional view illustrating a method for manufacturing the vertical MOSFET according to Modification 2 of Embodiment 4 of the present disclosure in the order of steps;

FIG. 27 is a cross-sectional view illustrating the method for manufacturing the vertical MOSFET according to Modification 2 of Embodiment 4 of the present disclosure in the order of steps;

FIG. 31 is a cross-sectional view illustrating the method for manufacturing the vertical MOSFET according to Embodiment 5 of the present disclosure in the order of steps;

DESCRIPTION OF EMBODIMENTS

Figure 1:
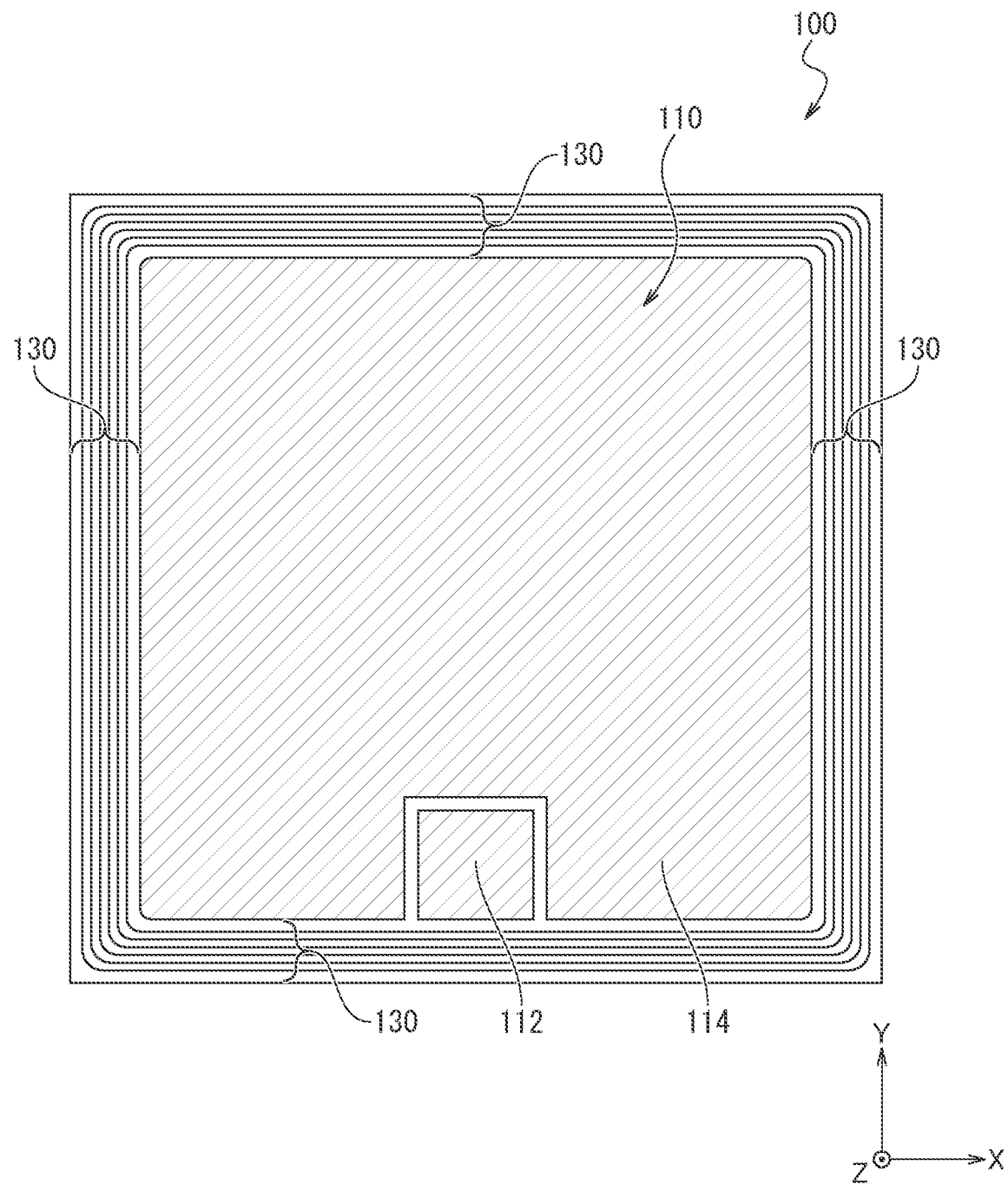
FIG. 1 is a plan view illustrating a configuration example of a GaN semiconductor device according to Embodiment 1 of the present disclosure.

Embodiments of the present invention will be described below. In the following description of the drawings, the same or similar portions are denoted by the same or similar reference numerals. However, it should be noted that the drawings are schematic and a relation between a thickness and a flat dimension, a ratio of thicknesses of respective devices or members, and the like are different from actual ones. Accordingly, specific thicknesses and dimensions should be determined with reference to the following description. In addition, it is certain that some portions have different dimensional relations and ratios between the drawings.

Additionally, the following description may describe directions by using terms "X-axis direction", "Y-axis direction", and "Z-axis direction". For example, the X-axis direction and the Y-axis direction are those parallel to a front surface 10a of a GaN substrate 10 to be described later. The X-axis direction and the Y-axis direction are also referred to as horizontal directions. Additionally, the Z-axis direction is a direction that intersects perpendicularly with the front surface 10a of the GaN substrate 10 (i.e., a thickness direction of the GaN substrate 10). The X-axis direction, the Y-axis direction, and the Z-axis direction are orthogonal to each other.

In addition, in the following description, the term "planar view" means, for example, viewing from the direction intersecting perpendicularly with the front surface 10a of the GaN substrate 10 to be described later (for example, the Z-axis direction).

Furthermore, the following description may refer to a positive direction of the Z-axis as "upper", and a negative direction thereof as "lower". The terms "upper" and "lower" do not necessarily mean a vertical direction relative to the ground. In other words, the "upper" and "lower" directions are not limited to the direction of gravity. The terms "upper" and "lower" are merely expressions of convenience that specify relative positional relationships in regions, layers, films, substrates, and the like, and do not limit the technological idea of the present disclosure. It is needless to say that, for example, if paper is rotated by 180 degrees, the designations of "upper" and "lower" would be reversed.

Still furthermore, in the following description, the symbols "+" and "−" attached to P and N indicating conductivity types mean that semiconductor regions attached with "+" or "−" are each relatively higher or lower in impurity concentration than those not attached therewith. However, the same symbols P and P (or N and N) attached to semiconductor regions do not mean that impurity concentration of each semiconductor region is exactly the same.

Embodiment 1

Configuration Example

FIG. 1 is a plan view illustrating a configuration example of a gallium nitride semiconductor device 100 according to Embodiment 1 of the present disclosure (an example of a "nitride semiconductor device" of the present disclosure; hereinafter referred to as GaN semiconductor device). FIG. 1 is an X-Y planar view. The GaN semiconductor device 100 illustrated in FIG. 1 is, for example, a power semiconductor device, and includes an active region 110 and an edge termination region 130. The active region 110 includes a gate pad 112 and a source pad 114. The gate pad 112 and the source pad 114 are electrode pads respectively electrically connected to a gate electrode 23 and a source electrode 25 to be described later.

On a planar view from the Z-axis direction, the edge termination region 130 surrounds the active region 110. The edge termination region 130 may include one or more guard ring or junction termination extension (JTE) structures. The edge termination region 130 may have a function of preventing electric field concentration in the active region 110 by spreading a depletion layer generated in the active region 110 to the edge termination region 130.

Figure 2:
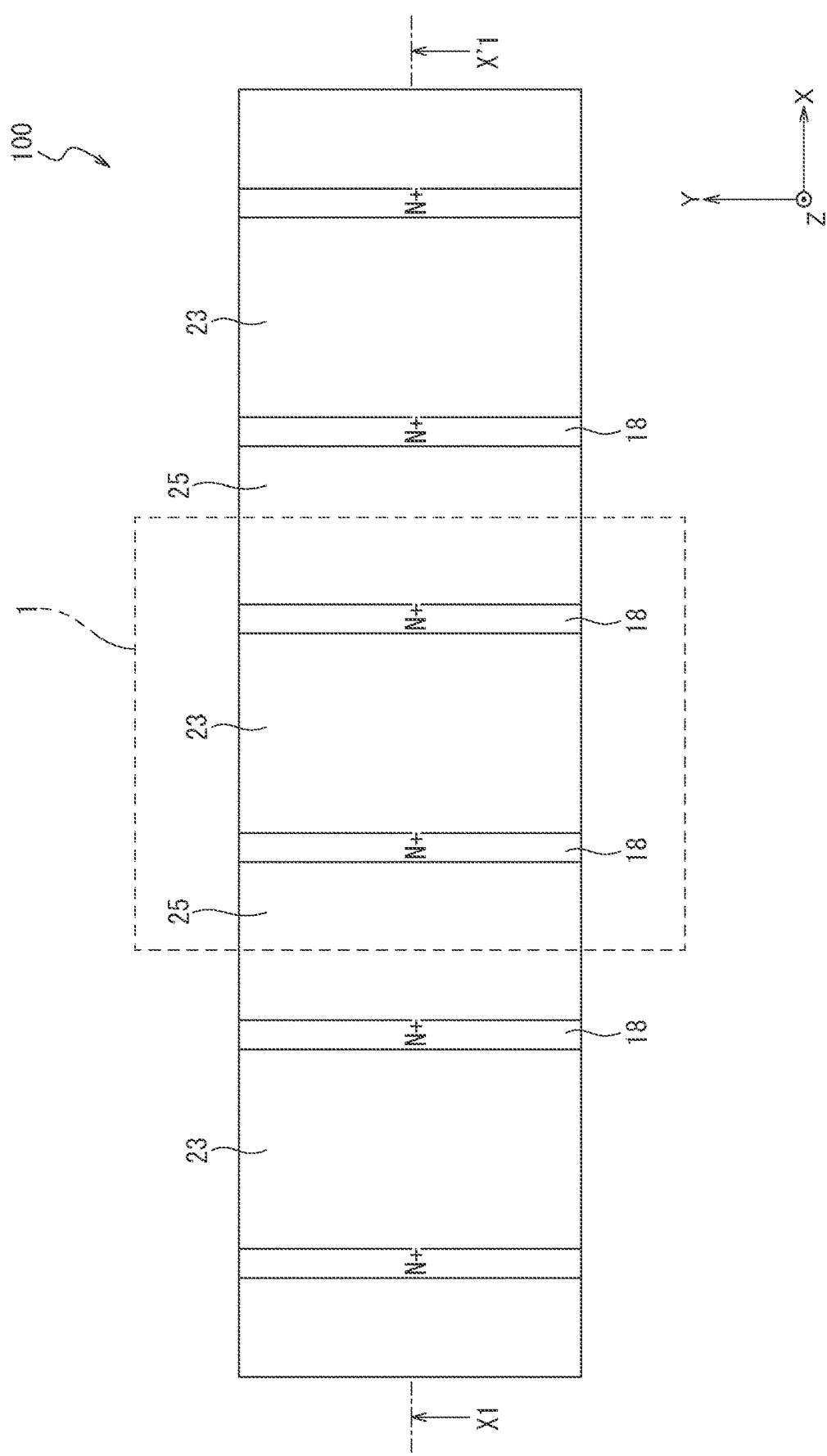
FIG. 2 is a plan view illustrating the configuration example of the GaN semiconductor device according to Embodiment 1 of the present disclosure.

FIG. 2 is a plan view illustrating the configuration example of the GaN semiconductor device 100 according to Embodiment 1 of the present disclosure. FIG. 2 illustrates an enlarged view of apart of the active region 110 illustrated in FIG. 1, but does not illustrate the gate pad 112 and the source pad 114 in order to exhibit shapes of N$^+$-type source region 18, the gate electrode 23 and the source electrode 25 on a planar view from the Z-axis direction.

Figure 3:
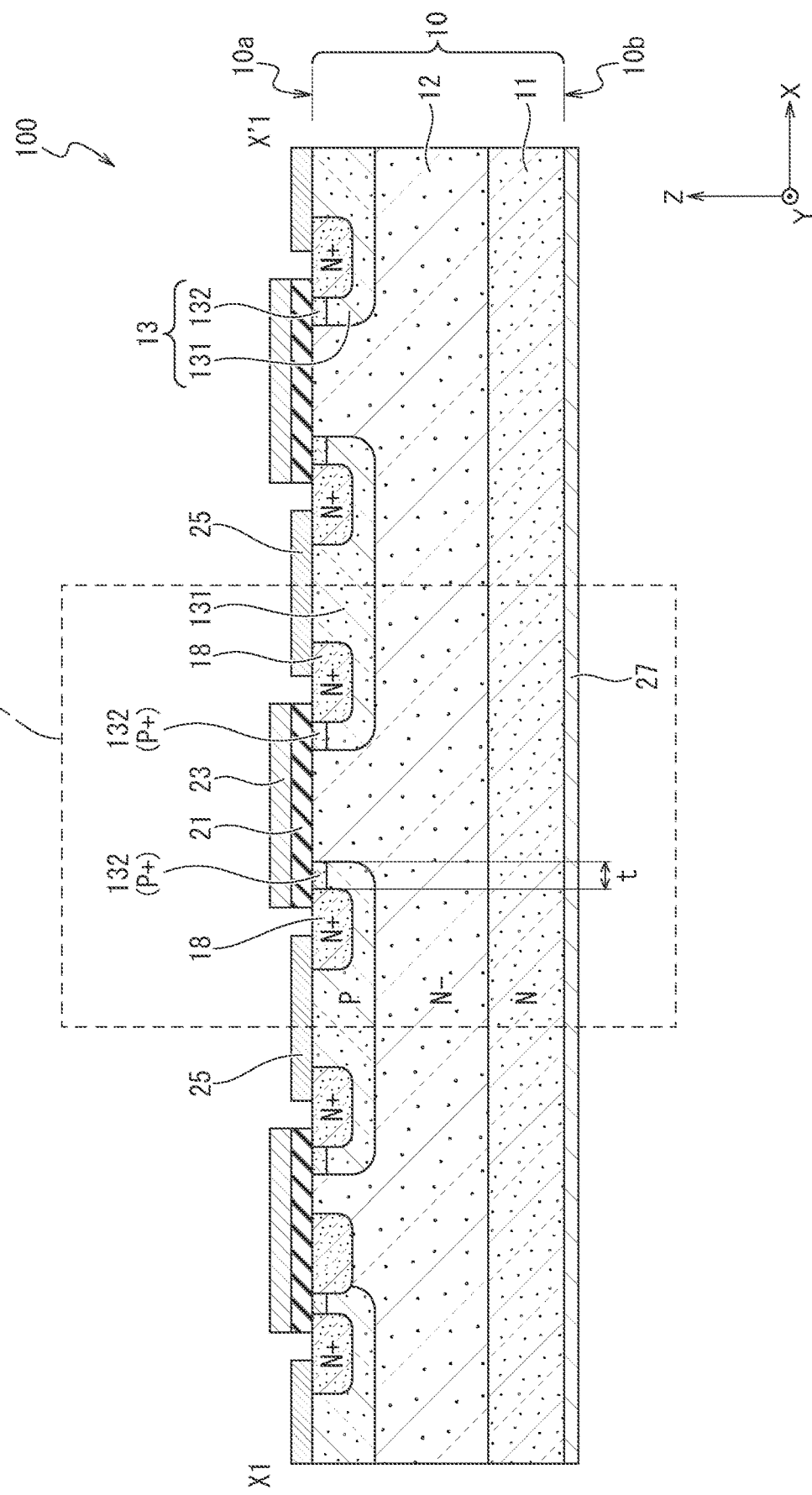
FIG. 3 is a cross-sectional diagram illustrating the configuration example of the GaN semiconductor device according to Embodiment 1 of the present disclosure.

FIG. 3 is a cross-sectional view illustrating the configuration example of the GaN semiconductor device 100 according to Embodiment 1 of the present disclosure. FIG. 3 illustrates a cross section taken along line X1-X'1 of the planar view of FIG. 2. As illustrated in FIGS. 2 and 3, the GaN semiconductor device 100 includes a gallium nitride substrate (hereinafter referred to as GaN substrate) 10 and a plurality of vertical metal oxide semiconductor field effect transistors (MOSFETs) 1 provided on the GaN substrate 10. On the GaN semiconductor device 100, the vertical MOSFETs 1 are repeatedly provided in one direction (for example, the X-axis direction). One vertical MOSFET 1 is a repeating unit structure, and the unit structures are arranged side by side in one direction (for example, the X-axis direction).

The GaN substrate 10 includes an N-type GaN monocrystalline substrate 11 and an N-type GaN layer 12 provided on the GaN monocrystalline substrate 11. The GaN monocrystalline substrate 11 is, for example, a c-plane GaN monocrystalline substrate. N-type impurities contained in the GaN monocrystalline substrate 11 are one or more elements of silicon (Si), oxygen (O), and Ge (germanium). One example of the N-type impurities contained in the GaN monocrystalline substrate 11 is Si or O. The GaN layer 12 is a monocrystalline GaN layer epitaxially grown on a front surface of the GaN monocrystalline substrate 11. The GaN layer 12 is formed by doping an N-type impurity in an epitaxial growth process. The N-type impurity is, for example, Si. The GaN layer 12 is used as a drift region of the vertical MOSFET. Hereinafter, the GaN layer 12 is also referred to as drift region.

The front surface 10$a$ side of the GaN substrate 10 (for example, a front surface side of the GaN layer 12) is provided with a P-type well region 13 and N$^+$-type source region 18.

The well region 13 is formed by ion implanting an acceptor element such as Mg into the front surface 10$a$ side of the GaN substrate 10 and activating by heat treatment. The well region 13 faces the front surface 10$a$ of the GaN substrate 10.

The source region 18 is formed by ion implanting a donor element such as Si into the front surface 10$a$ side of the GaN substrate 10 and activating by heat treatment. The source region 18 faces the front surface 10$a$ of the GaN substrate 10. The source region 18 is located inside the well region 13, and is in contact with the well region 13.

A gate insulating film 21 is provided on front surfaces of the drift region 12 and the well region 13. The gate insulating film 21 is a silicon (Si) oxide, an aluminum (Al) oxide, or a mixture of a Si oxide and an Al oxide. For example, the gate insulating film 21 is a $SiO_2$ film, an $Al_2O_3$ film, or an AlSiO film. The gate insulating film 21 has a film thickness of, for example, from 50 nm to 100 nm.

In the vertical MOSFET 1, primarily, a channel is formed at and near a contact interface between the gate insulating film 21 and the well region 13 (for example, a second well region 132 to be described later).

As illustrated in FIG. 3, the gate electrode 23 is formed on the gate insulating film 21. The source electrode 25 is formed on the source region 18. The source electrode 25 is also in contact with the source region 18 and the well region 13 (for example, a first well region 131 to be described later). A drain electrode 27 is provided on a back surface 10$b$ side of the GaN substrate 10, which is an opposite side of the front surface 10$a$ thereof. The drain electrode 27 is in contact with the GaN monocrystalline substrate 11.

In the GaN semiconductor device 100, the well region 13 includes the first well region 131 and the second well region 132 that is higher in acceptor element concentration (for example, Mg concentration) than the first well region 131. The second well region 132 is located between the first well region 131 and the gate insulating film 21, and is in contact with the source region 18.

The Mg concentration of the first well region 131 is from $5E+16$ cm$^{-3}$ to below $5E+17$ cm$^{-3}$. The Mg concentration of the second well region 132 is from $5E+17$ cm$^{-3}$ to below $1E+19$ cm$^{-3}$. When a thickness of the second well region 132 in a normal direction (for example, the Z-axis direction) of an interface between the well region 13 and the gate insulating film 21 is assumed to be t, the thickness t is from 1 nm to 90 nm.

When the Mg concentration of the second well region 132 is assumed to be Na (cm$^{-3}$) and the thickness of the second well region 132 is assumed to be t (nm), the following formula (1) holds between Na and t:

$$1E+10 \text{ cm}^{-2} < Na \times t < 2E+13 \text{ cm}^{-2} \quad (1)$$

Formula (1) is obtained based on a calculation performed by the present inventor, as will be described in <Suitable Range of Na×t>below.

Note that "E" is an exponential notation indicating powers of 10. For example, $1E+10$ means $1 \times 10^{10}$, and $2E+13$ means $2 \times 10^{13}$.

(Manufacturing Method)

Figure 4:
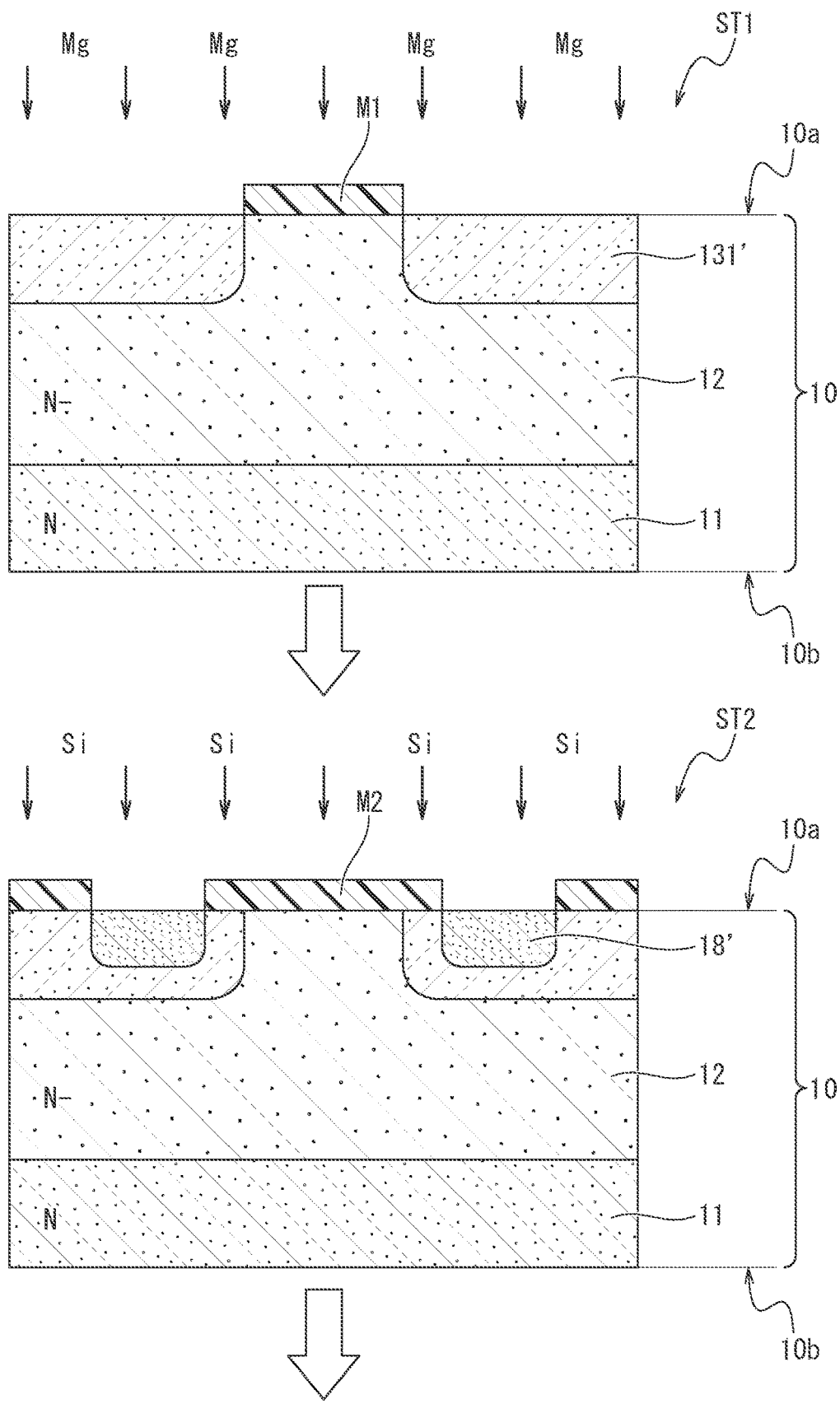
FIG. 4 is a cross-sectional view illustrating a method for manufacturing the GaN semiconductor device according to Embodiment 1 of the present disclosure in the order of steps.
Figure 5:
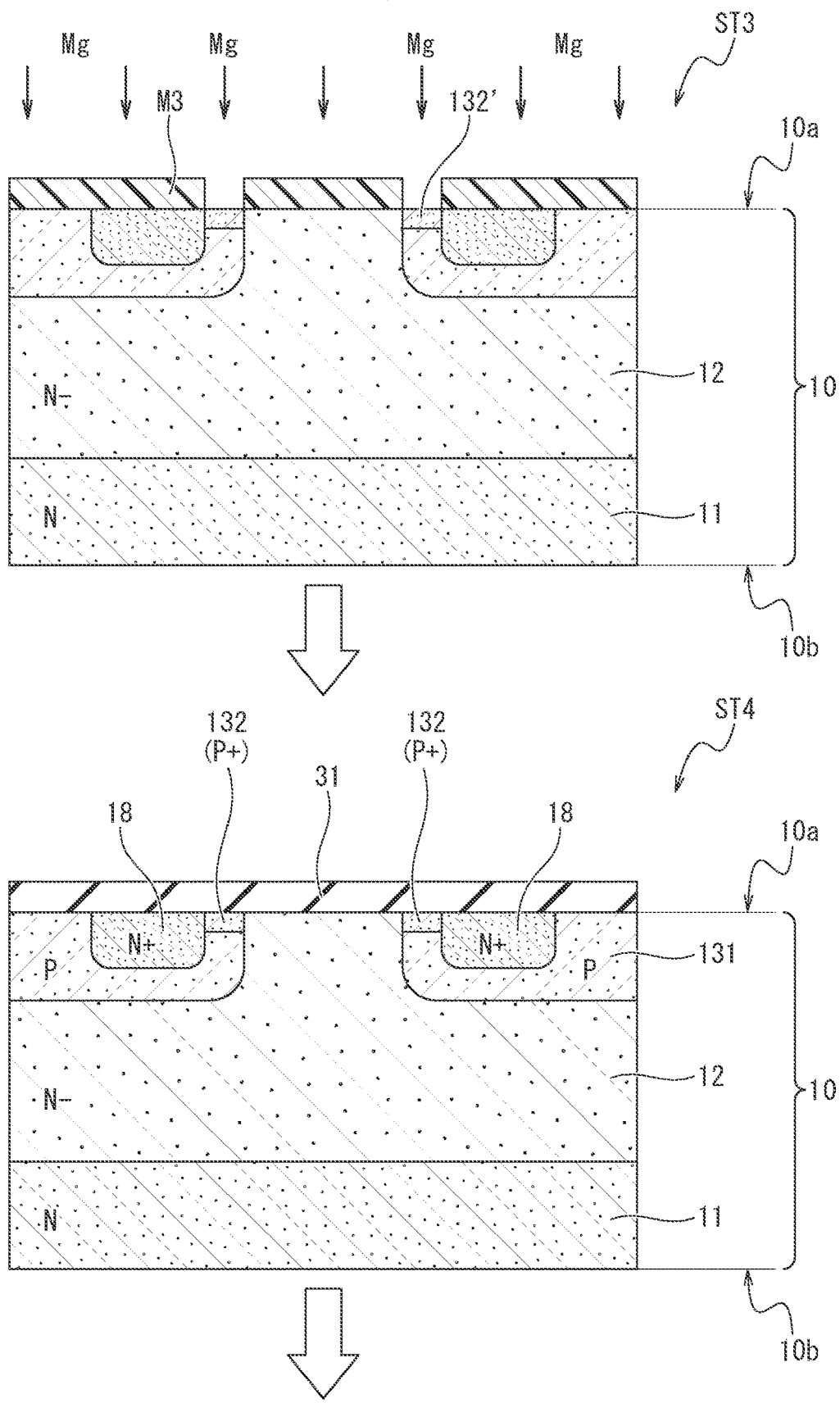
FIG. 5 is a cross-sectional view illustrating the method for manufacturing the GaN semiconductor device according to Embodiment 1 of the present disclosure in the order of steps.
Figure 6:
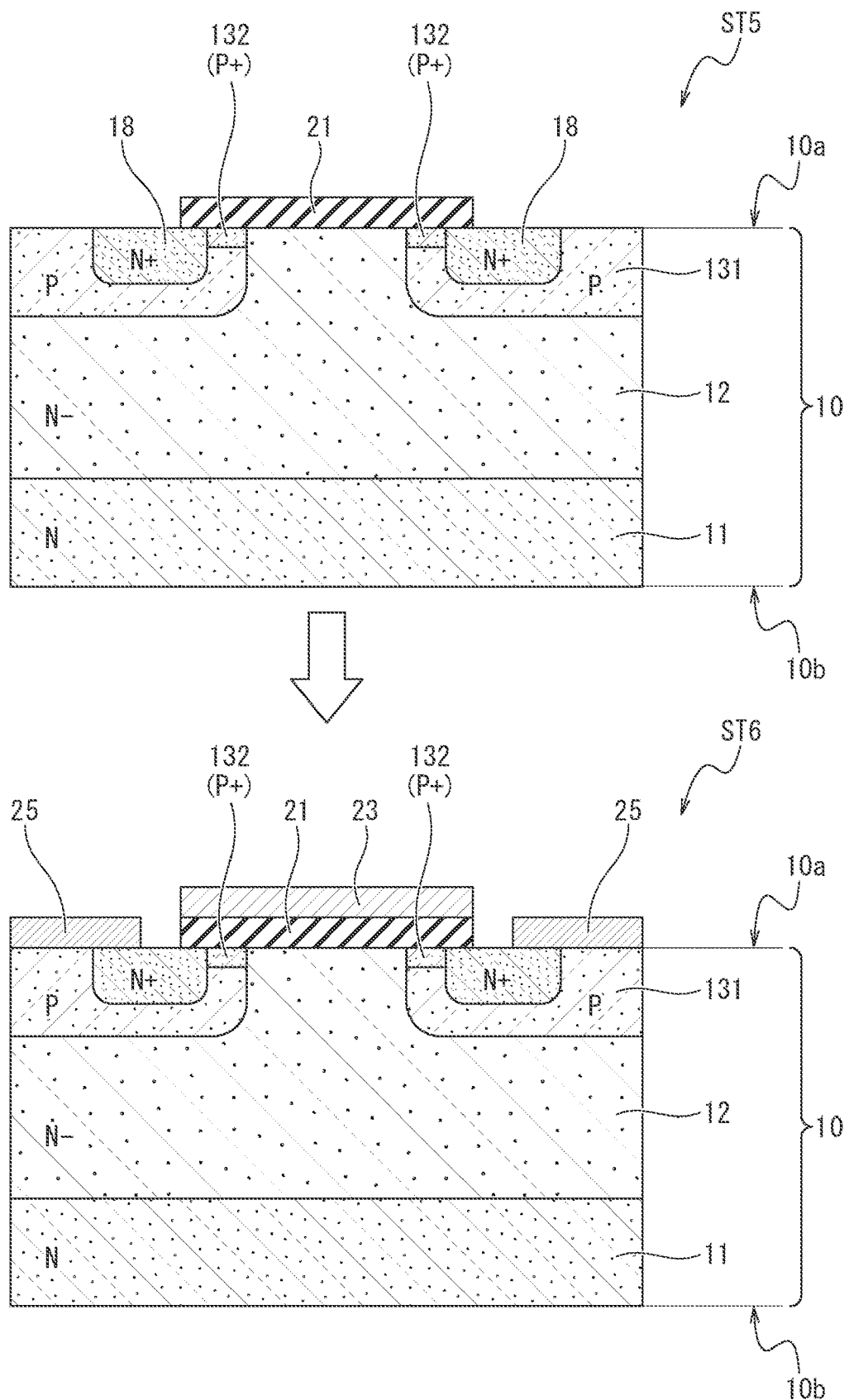
FIG. 6 is a cross-sectional view illustrating the method for manufacturing the GaN semiconductor device according to Embodiment 1 of the present disclosure in the order of steps.

Next, a description is given of a method for manufacturing the GaN semiconductor device 100 according to Embodiment 1 of the present disclosure. FIGS. 4 to 6 are cross-sectional views illustrating the method for manufacturing the GaN semiconductor device 100 according to Embodiment 1 of the present disclosure in the order of steps. The GaN semiconductor device 100 is manufactured by various equipment, such as film-forming equipment (including a chemical vapor deposition (CVD) device, an epitaxial growth device, and a sputtering device), an exposure device, an etching device, an ion implanter, and a heat treatment device. Hereinafter, these various types of devices are collectively referred to as manufacturing equipment.

As illustrated in step ST1 of FIG. 4, the manufacturing equipment performs ion implantation for forming the first well region 131 (see FIG. 3). For example, the manufacturing equipment forms a mask M1 that exposes the top of each region where the first well region 131 is to be formed (hereinafter referred to as first well forming region 131') and covers the top of the other region on the front surface 10a of the GaN substrate 10, and ion implants Mg as an acceptor element into the GaN substrate 10 formed with the mask M1. The mask M1 is, for example, a resist pattern. After the ion implantation, the manufacturing equipment removes the mask M1 from the GaN substrate 10.

In the ion implantation step for forming the first well region 131, Mg implantation energy (acceleration voltage) is set so that the first well region 131 is formed deeper from the front surface 10a of the GaN substrate 10 than each of the source region 18 (see FIG. 3) and the second well region 132 (see FIG. 3). The ion implantation step maybe performed either by single-stage ion implantation with a single acceleration energy condition or by multi-stage ion implantation with a plurality of acceleration energy conditions. Additionally, in this ion implantation step, the dosage of Mg is set so that the Mg concentration in the first well region 131 is from $5E+16$ $cm^{-3}$ to below $5E+17$ $cm^{-3}$ (as one example, $5E+17$ $cm^{-3}$).

In addition, in order to suppress the generation of crystal defects due to ion implantation, a through film (such as, for example, an $SiO_2$ film, an SiN film, or an AlN film) may be formed on the front surface 10a of the GaN substrate in advance before ion implantation. The through film may be left in place even after the ion implantation of step ST1, and may be removed after ion implantation of step ST3. Alternatively, the through film may be removed after the ion implantation of step ST1. In this case, at each of steps ST2 and ST3 to be described later, a new through film may be also formed before ion implantation.

Next, as illustrated in step ST2 of FIG. 4, the manufacturing equipment performs ion implantation for forming the source region 18 (see FIG. 3). For example, the manufacturing equipment forms a mask M2 that exposes the top of each region where the source region 18 is to be formed (hereinafter referred to as source forming region 18') and covers the tops of the other regions on the front surface 10a of the GaN substrate 10, and ion implants Si as a donor element into the GaN substrate 10 formed with the mask M2. The mask M2 is, for example, a resist pattern. After the ion implantation, the manufacturing equipment removes the mask M2 from the GaN substrate 10.

In the ion implantation step for forming the source region 18, the dosage of Si is set so that Si concentration in the source region 18 is equal to or more than the Mg concentration contained in the same region. For example, the dosage of Si is set so that the Si concentration in the source region 18 is $1E+19$ $cm^{-3}$.

Next, as illustrated in step ST3 of FIG. 5, the manufacturing equipment performs ion implantation for forming the second well region 132 (see FIG. 3). For example, the manufacturing equipment forms a mask M3 that exposes the top of each region where the second well region 132 is to be formed (hereinafter referred to as second well forming region 132') and covers the tops of the other regions on the front surface 10a of the GaN substrate 10, and ion implants Mg as an acceptor element into the GaN substrate 10 formed with the mask M3. The mask M3 is, for example, a resist pattern. After the ion implantation, the manufacturing equipment removes the mask M3 from the GaN substrate 10.

In the ion implantation step for forming the second well region 132, the Mg implantation energy (acceleration voltage) is set so that the second well region 132 is formed shallower from the front surface 10a of the GaN substrate 10 than each of the first well region 131 and the source region 18. Additionally, in this ion implantation step, the dosage of Mg is set so that the Mg concentration in the second well region 132 is $3E+18$ $cm^{-3}$.

In addition, the ion implantation for forming the second well region 132 may be performed either under a single implantation energy condition (i.e., single-stage ion implantation) or under multi-stage implantation energy conditions (i.e., multi-stage ion implantation). Particularly, in the case of single-stage ion implantation, the second well region 132 is formed into a shape that has a peak region where acceptor concentration (for example, Mg concentration) is at maximum in a thickness direction thereof. The thickness direction of the second well region 132 is the normal direction of the interface between the well region 13 and the gate insulating film 21, and is the Z-axis direction in Embodiment 1.

Next, as illustrated in step ST4 of FIG. 5, the manufacturing equipment forms a protective film 31 on the front surface 10a of the GaN substrate 10. For example, an aluminum nitride (AlN) film, a silicon dioxide ($SiO_2$) film, or a silicon nitride (SiN) film is used as the protective film 31. Then, the manufacturing equipment performs heat treatment on the GaN substrate 10. The heat treatment is, for example, rapid heat treatment. The heat treatment activates the Mg and Si ion implanted into the GaN substrate 10 to form the first well region 131 of P-type, the second well region 132 of $P^+$-type, and the source region 18 of $N^+$-type and define the drift region 12. The heat treatment can also recover defects caused by the ion implantation of Mg and Si in the GaN substrate 10 to some extent. After the heat treatment, the manufacturing equipment removes the protective film 31 from the GaN substrate 10.

Next, as illustrated in step ST5 of FIG. 6, the manufacturing equipment forms the gate insulating film 21 on the front surface 10a of the GaN substrate 10. For example, the manufacturing equipment forms an $SiO_2$ film as the gate insulating film 21 to a thickness of 100 nm by a plasma CVD process.

Next, as illustrated in step ST6 of FIG. 6, the manufacturing equipment forms the gate electrode 23 and the source electrode 25. Then, the manufacturing equipment forms an interlayer insulating film (not illustrated) on the front surface 10a of the GaN substrate 10 so as to cover the gate electrode 23 and the source electrode 25. Next, the manufacturing equipment forms the gate pad 112 (see FIG. 1) to be electrically connected to the gate electrode 23 and the source pad 114 (see FIG. 1) to be electrically connected to the source electrode 25. After that, the manufacturing equipment forms the drain electrode 27 (see FIG. 3) on the back surface 10b of the GaN substrate 10. The vertical MOSFET 1 according to Embodiment 1 is completed through such steps.

Comparative Example

Figure 7:
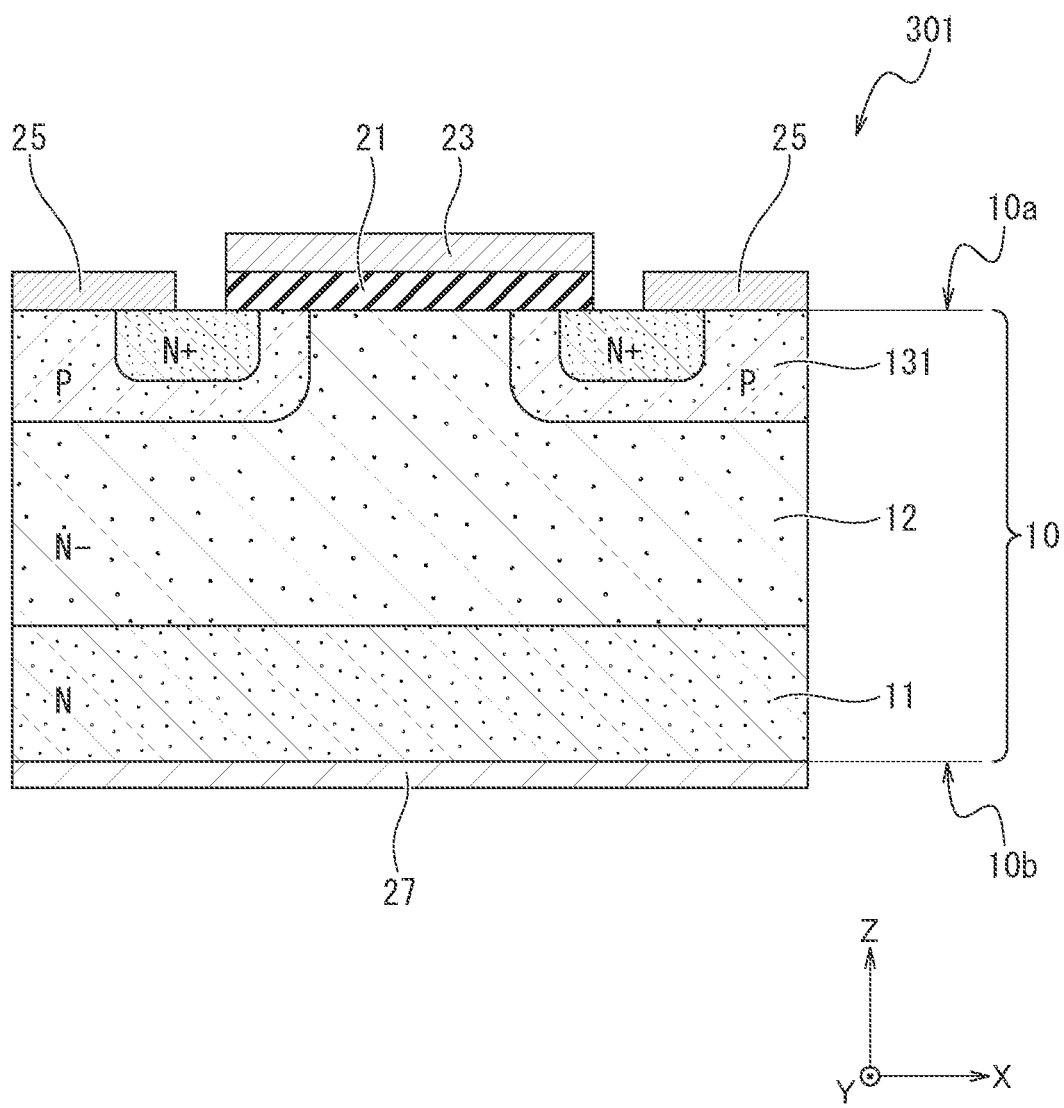
FIG. 7 is a cross-sectional view illustrating a configuration example of a vertical MOSFET according to Comparative Example of the present disclosure.

FIG. 7 is a cross-sectional view illustrating a configuration example of a vertical MOSFET 301 according to Comparative Example of the present disclosure. The vertical MOSFET 301 according to Comparative Example is different from the vertical MOSFET 1 (see FIG. 3) according to Embodiment 1 in that the well region 13 is formed only by a P-type first well region. The vertical MOSFET 301 according to Comparative Example include no P⁺-type second well region (see FIG. 3). Therefore, compared to the vertical MOSFET 1 according to Embodiment 1 of the present disclosure, more hole traps due to Ga—O bonding are present at an interface (GaN/SiO2) between the GaN substrate 10 and the gate insulating film 21 in the vertical MOSFET 301 according to Comparative Example. The presence of the more hole traps deteriorates the C-V characteristics and I-V characteristics of the vertical MOSFET.

(CV Characteristics)

Figure 8:
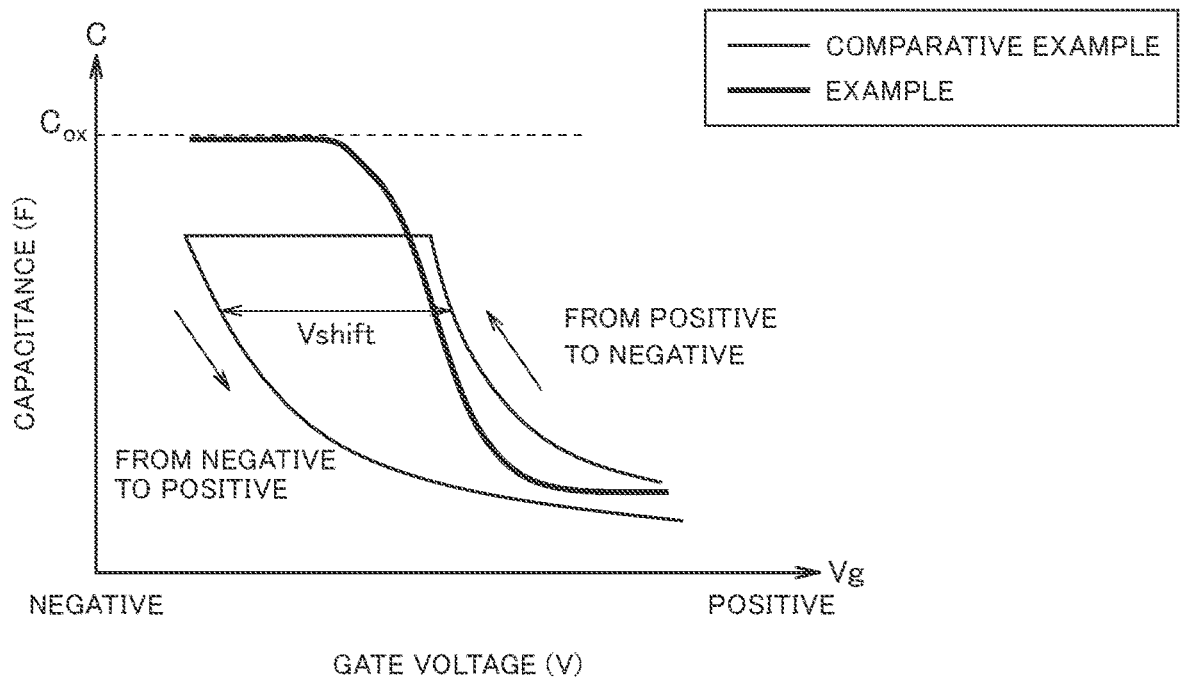
FIG. 8 is a diagram illustrating results of a comparison of CV characteristics in Embodiment 1 (Example) and Comparative Example of the present disclosure.

FIG. 8 is a diagram illustrating results of a comparison of CV characteristics in the vertical MOSFET 1 according to Embodiment 1 (hereinafter also referred to as Example) and the vertical MOSFET 301 according to Comparative Example of the present disclosure. The horizontal axis in FIG. 8 represents gate voltage Vg (V) to be applied to the gate electrode of each vertical MOSFET, and the vertical axis in FIG. 8 represents capacitance C (F) generated between the gate electrode and drain electrode of the each vertical MOSFET. $C_{ox}$ on the vertical axis indicates capacitance value of the gate insulating film 21.

The CV characteristics of the vertical MOSFETs are measured by fixing the drain and source electrodes at aground potential (for example, 0 (V)) and applying a bias voltage to the gate electrode in this state. Vshift illustrated in FIG. 8 indicates an amount of voltage shift between a curve when swept from positive to negative bias and a curve when swept from negative to positive bias.

Since Comparative Example does not include the P⁺-type second well region 132, hole traps at the GaN/SiO₂ interface are not reduced. Therefore, as illustrated in FIG. 8, the Vshift of Comparative Example is large, and the CV characteristics thereof exhibit a hysteresis curve. The hole traps are undesirable since they cause channel mobility reduction of the vertical MOSFET and variation in a threshold voltage Vth.

On the other hand, since Example includes the P⁺-type second well region 132, hole traps at the GaN (P-type well region)/SiO₂ interface are reduced. As a result, the Vshift can be reduced and close to zero (0). As a result, Example can suppress channel mobility reduction of the vertical MOSFET and can reduce variation in the threshold value Vth.

(IV Characteristics)

Figure 9:
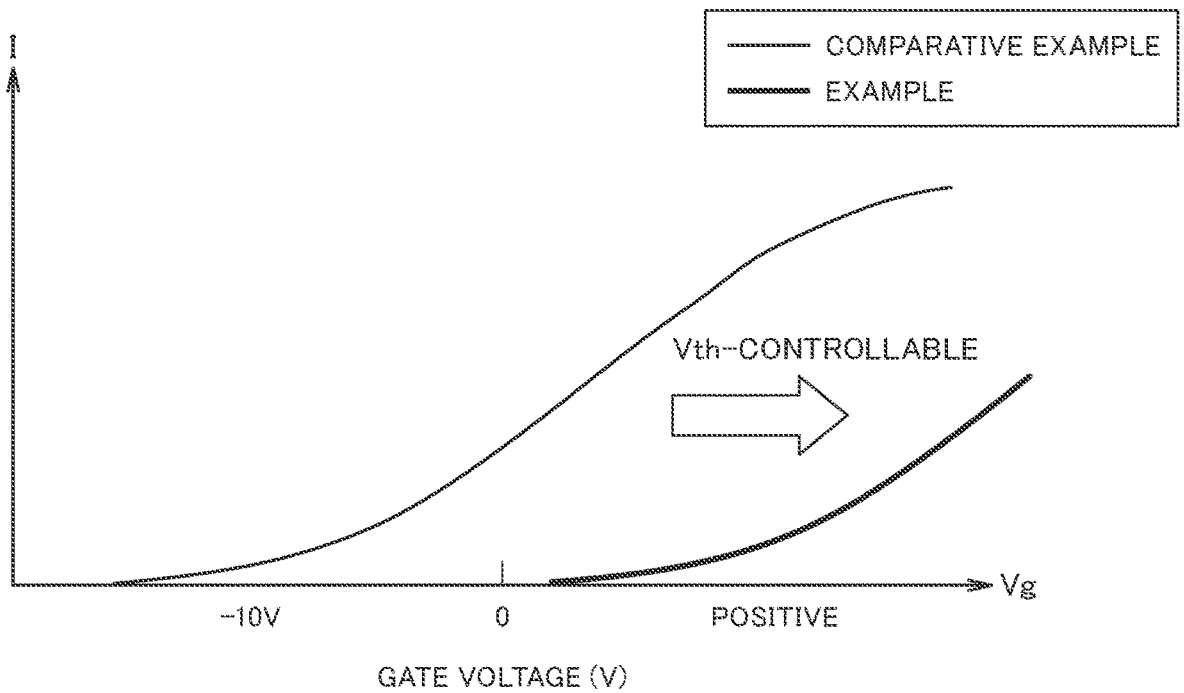
FIG. 9 is a diagram illustrating results of a comparison of IV characteristics in Embodiment 1 (Example) and Comparative Example of the present disclosure.

FIG. 9 is a diagram illustrating results of a comparison of IV characteristics in the vertical MOSFET 1 according to Embodiment 1 (Example) and the vertical MOSFET 301 according to Comparative Example of the present disclosure. The horizontal axis in FIG. 9 represents gate voltage Vg (V) applied to the gate electrode of each vertical MOSFET, and the vertical axis in FIG. 9 represents drain current I (A) of the each vertical MOSFET.

Comparative Example does not include the P⁺-type second well region 132. Therefore, as illustrated in FIG. 9, The threshold voltage Vth of Comparative Example is low. On the other hand, since Example includes the P⁺-type second well region 132 on the P-type first well region 131, the threshold voltage Vth can be increased compared to Comparative Example above. Example can easily control the threshold voltage Vth to a desired value by adjusting a composition (for example, Mg concentration) of the second well region 132 and the thickness t of the second well region 132.

Effects of Embodiment 1

As illustrated above, the GaN semiconductor device 10 according to Embodiment 1 of the present disclosure includes the GaN substrate 10 and the vertical MOSFET 1 provided on the GaN substrate 10. The vertical MOSFET 1 includes the N-type drift region 12 provided in the GaN substrate 10, the P-type well region 13 provided in the drift region 12, the N-type source region 18 provided in the well region 13, the gate insulating film 21 provided on the front surface of the well region 13, and the gate electrode 23 provided on the front surface of the well region 13 via the gate insulating film 21. The well region 13 includes the P-type first well region 131 and the P⁺-type second well region 132 that is higher in acceptor element concentration (for example, Mg concentration) than the first well region 131. The second well region 132 is located between the first well region 131 and the gate insulating film 21, and is in contact with the source region 18.

According to the above configuration, hole traps at the interface between the P⁺-type second well region 132 and the gate insulating film 21 can be reduced. Since a channel of the vertical MOSFET 1 is formed near the interface, channel mobility reduction and variation in the threshold voltage Vth due to the hole traps can be suppressed.

Additionally, since the channel is formed in a layered structure of the P⁺-type second well region 132 and the first well region 131, the threshold voltage Vth can be more easily controlled to a desired value than in Comparative Example above. For example, adjusting the acceptor element concentration (hereinafter also referred to as acceptor concentration) Na of the second well region 132 and the thickness t of the second well region 132 can facilitate control of the threshold voltage Vth to a desired value. The thickness t of the second well region 132 is a thickness in the normal direction of the interface between the second well region 132 and the gate insulating film 21, and is a thickness in the Z-axis direction in Embodiment 1. This can suppress deterioration in electrical characteristics such as, for example, an increased switching loss.

Thus, the GaN semiconductor device 100 can reduce hole traps while suppressing deterioration in the electrical characteristics of the vertical MOSFET 1.

Modification 1

Figure 10:
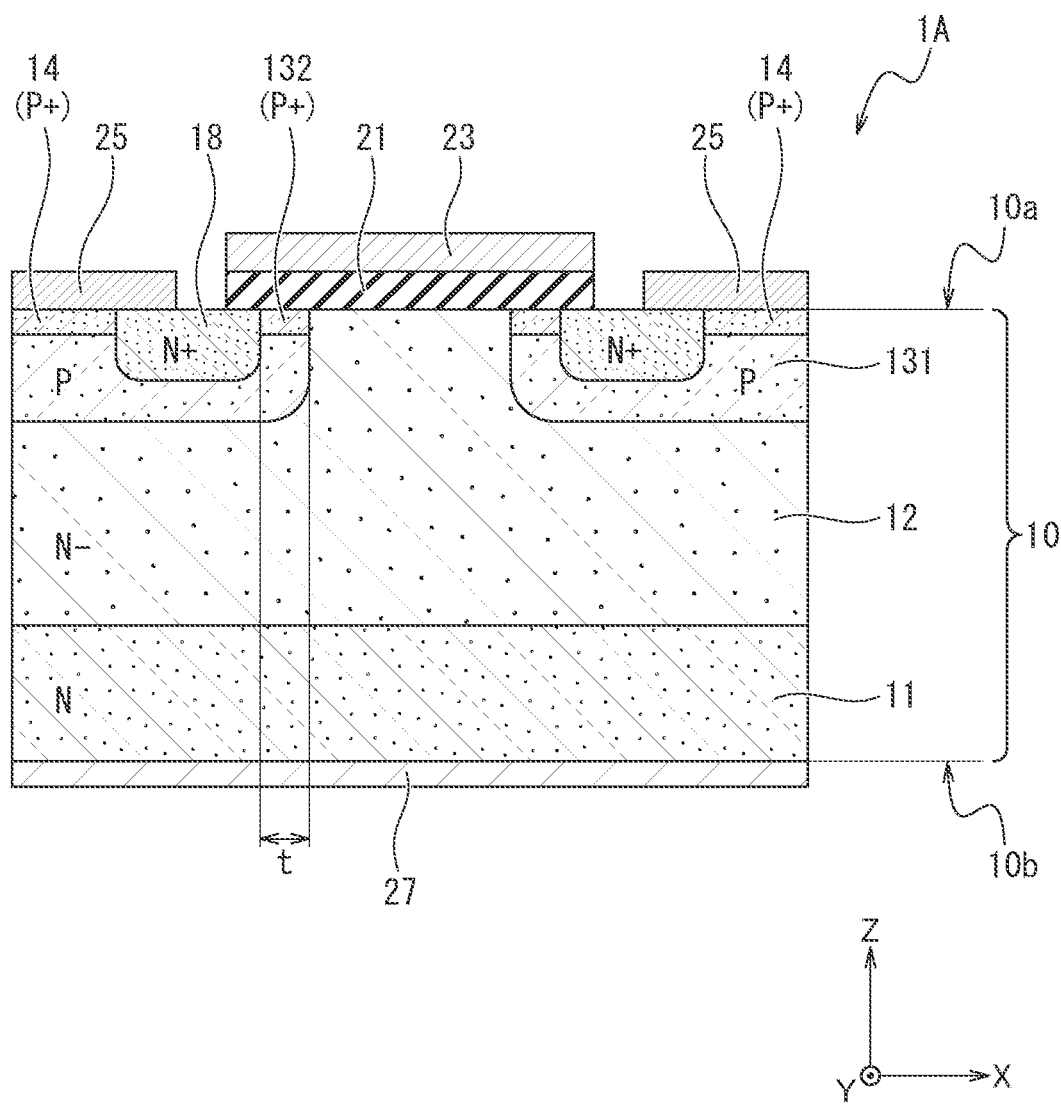
FIG. 10 is a cross-sectional view illustrating a vertical MOSFET according to Modification 1 of Embodiment 1 of the present disclosure.

The vertical MOSFET according to the embodiment of the present disclosure may include a high-concentration (for example, P⁺-type) contact region to be connected to the source electrode 25. FIG. 10 is a cross-sectional view illustrating a vertical MOSFET 1A according to Modification 1 of Embodiment 1 of the present disclosure. As illustrated in FIG. 10, the vertical MOSFET 1A according to Modification 1 of Embodiment 1 includes a P⁺-type contact region 14 provided in the GaN substrate 10.

The P⁺-type contact region 14 is formed, for example, by ion implanting an acceptor element such as Mg into the front surface 10a side of the GaN substrate 10 and activating by heat treatment. The contact region 14 faces the front surface 10a of the GaN substrate 10. The contact region 14 is located inside the well region 13, and is in contact with the well region 13.

Although not illustrated, in the above modification, the vertical MOSFET 1A illustrated in FIG. 10 is repeatedly provided in one direction (for example, the X-axis direction). One vertical MOSFET 1A is a repeated unit structure, and these unit structures are aligned side-by-side in one direction (for example, the X-axis direction). As a result, the N⁺-type source region 18 is located on both sides of the contact region 14. The contact region 14 is also in contact with the source regions 18. The source electrode 25 is provided on the source regions 18 and the contact region 14.

Bonding the source electrode 25 to the P+-type contact region 14 can form a source contact excellent in ohmic properties. The contact region 14 can further increase the ohmic properties of connection between the source electrode 25 and the P-type first well region 131.

The P+-type contact region 14 may be formed simultaneously in the same step as the P+-type second well region 132 or formed separately from the P+-type second well region 132.

Figure 11:
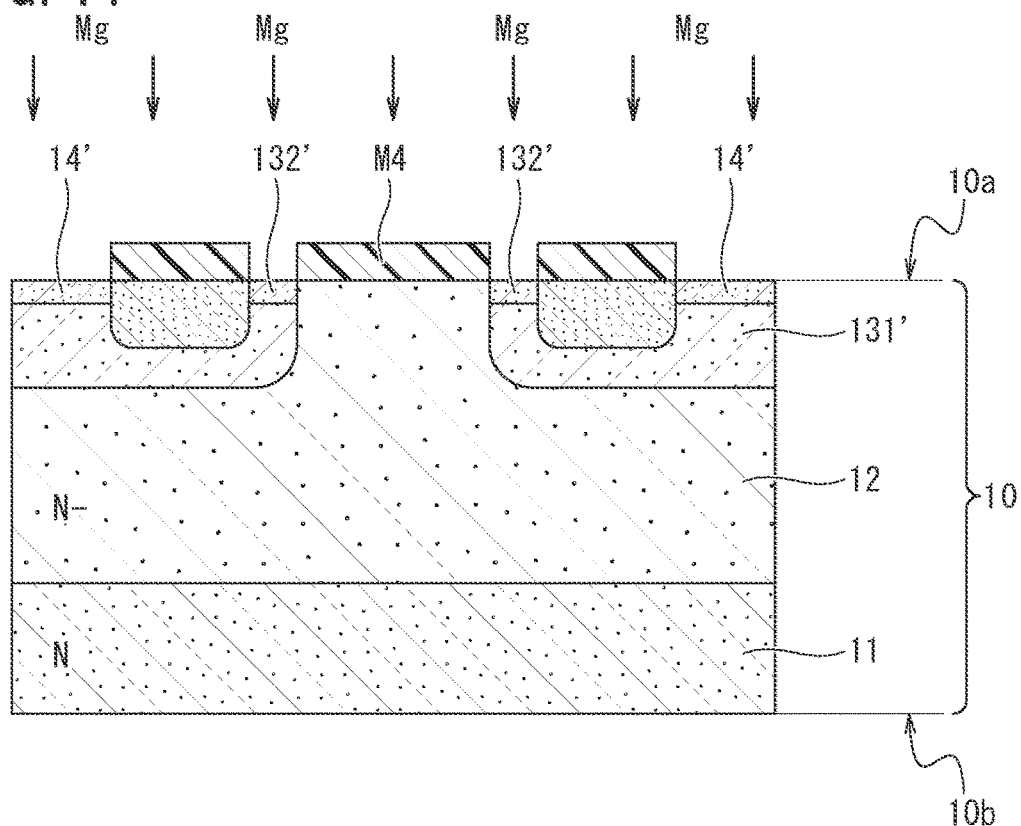
FIG. 11 is a cross-sectional view illustrating a method (I) for manufacturing the vertical MOSFET according to Modification 1 of Embodiment 1 of the present disclosure.

FIG. 11 is a cross-sectional view illustrating a method (I) for manufacturing the vertical MOSFET 1A according to Modification 1 of Embodiment 1 of the present disclosure. When forming the contact region 14 and the second well region 132 simultaneously in the same step, the manufacturing equipment forms a mask M4 that exposes the top of the second well forming region 132' and the top of each region where the contact region 14 is to be formed (hereinafter referred to as contact forming region 14') and covers the tops of the other regions on the front surface 10a of the GaN substrate 10, as illustrated in FIG. 11. Then, the manufacturing equipment ion implants Mg as an acceptor element into the GaN substrate formed with the mask M4. After the ion implantation of Mg, the manufacturing equipment removes the mask M4, and then performs heat treatment for Mg activation. The heat treatment for Mg activation may be performed to also serve as impurity activation of the other regions (for example, the source forming region and the first well forming region). As a result, the manufacturing equipment can form the contact region 14 that has the same Mg concentration distribution from the front surface 10a of the GaN substrate 10 into a depth direction as that of the second well region 132.

Figure 12:
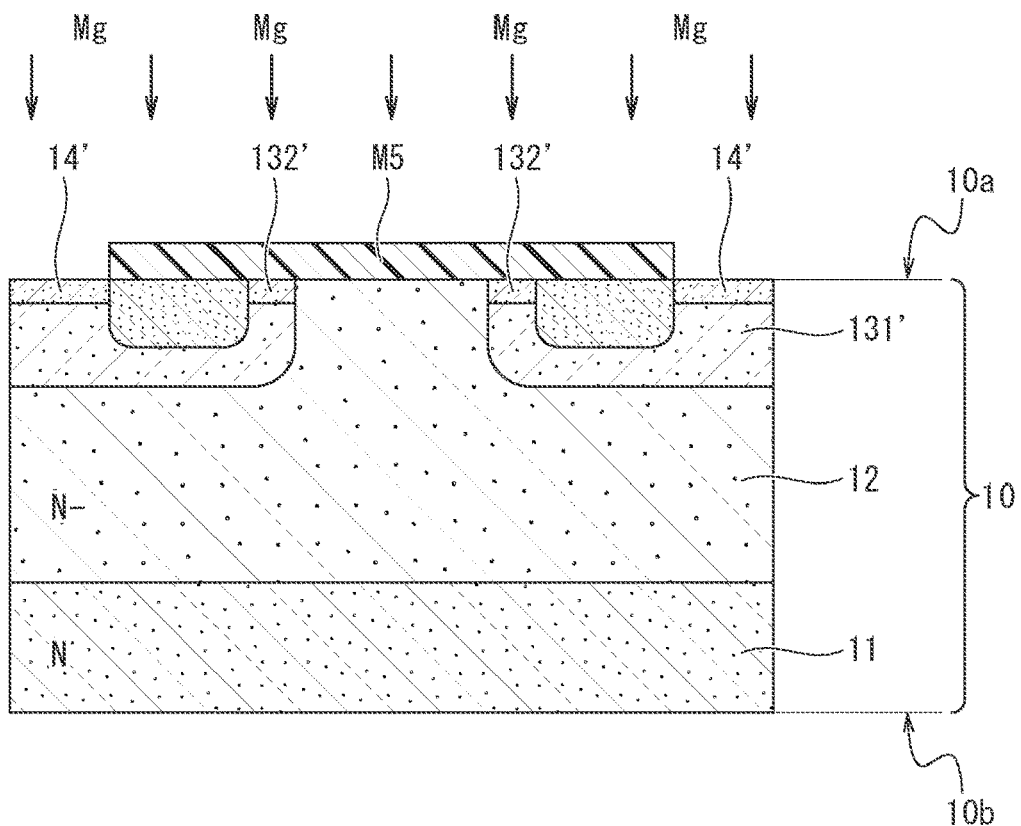
FIG. 12 is a cross-sectional view illustrating a method (II) for manufacturing the vertical MOSFET according to Modification 1 of Embodiment 1 of the present disclosure.

FIG. 12 is a cross-sectional view illustrating a method (II) for manufacturing the vertical MOSFET LA according to Modification 1 of Embodiment 1 of the present disclosure. When forming the contact region 14 and the second well region 132 separately, the manufacturing equipment forms a mask M5 that exposes the top of each contact forming region 14' and covers the tops of the other regions on the front surface 10a of the GaN substrate 10, as illustrated in FIG. 12. Then, the manufacturing equipment ion implants Mg as an acceptor element into the GaN substrate 10 formed with the mask M5. After the ion implantation of Mg, the manufacturing equipment removes the mask M5, and then performs heat treatment for Mg activation. The heat treatment for Mg activation may be performed to also serve as impurity activation of the other regions (for example, the source forming region, the first well forming region, and the second well forming region). As a result, the manufacturing equipment can form the contact region 14 that has a different Mg concentration distribution from the front surface 10a of the GaN substrate 10 into the depth direction from that of the second well region 132.

Modification 2

Figure 13:
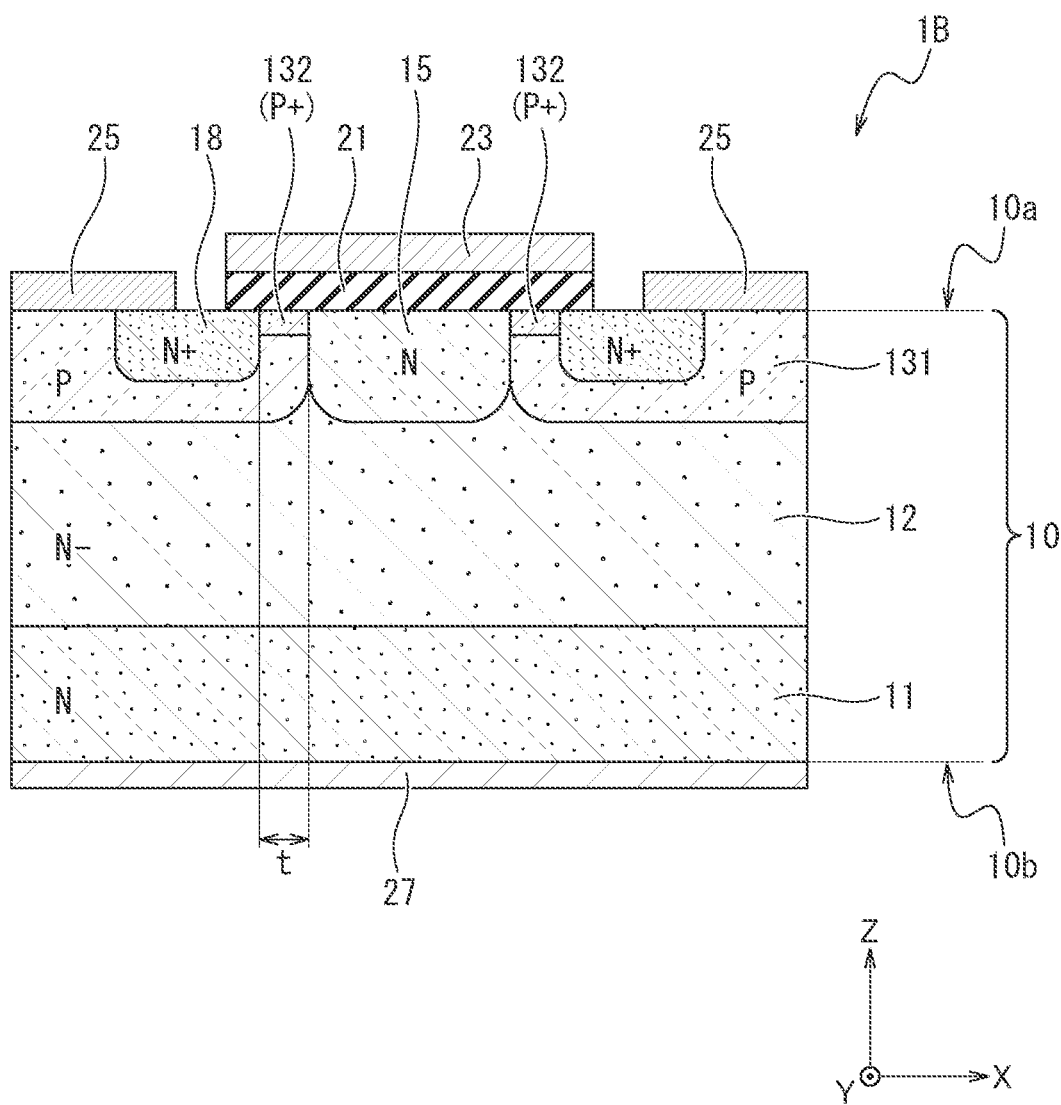
FIG. 13 is a cross-sectional view illustrating a vertical MOSFET according to Modification 2 of Embodiment 1 of the present disclosure.

The vertical MOSFET according to the embodiment of the present disclosure may include a JFET region higher in donor element concentration than the drift region 12. FIG. 13 is a cross-sectional view illustrating a vertical MOSFET 1B according to Modification 2 of Embodiment 1 of the present disclosure. As illustrated in FIG. 13, the vertical MOSFET 1B according to Modification 2 of Embodiment 1 includes an N-type JFET region 15 higher in donor element (for example, Si) concentration than the drift region 12 in a region sandwiched from both sides by the well region 13 in the GaN substrate 10. The Si concentration in the JFET region 15 is, for example, $1E+17$ cm$^{-3}$. The JFET region 15 functions as a current path between the drift region 12 and the well region 13. The JFET region 15 has a higher Si concentration and lower resistance than the drift region 12, thus enabling reduced on-resistance of the vertical MOSFET 1B.

Figure 14:
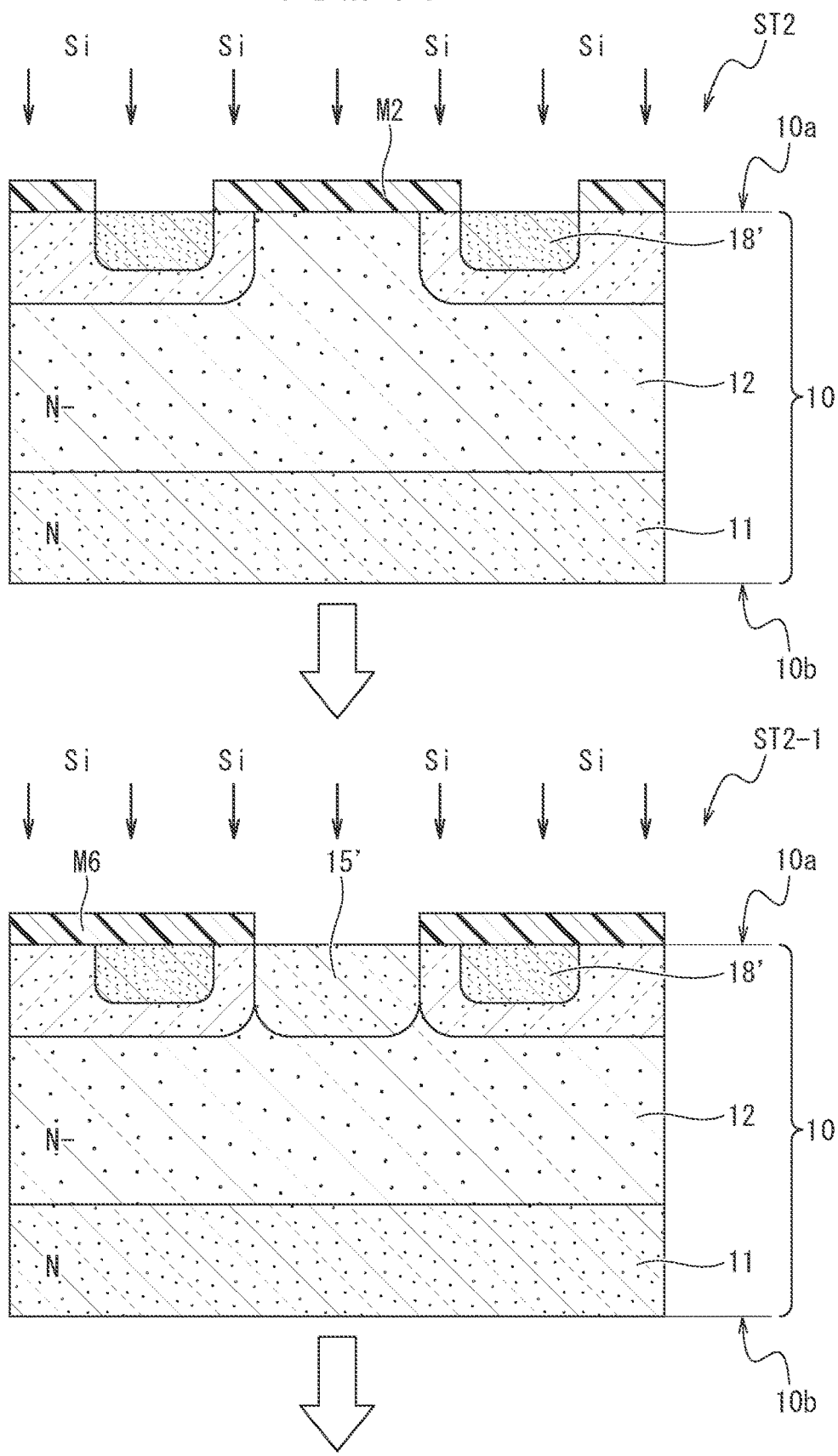
FIG. 14 is a cross-sectional view illustrating a method for manufacturing the vertical MOSFET according to Modification 2 of Embodiment 1 of the present disclosure in the order of steps.

FIG. 14 is a cross-sectional view illustrating a method for manufacturing the vertical MOSFET 1B according to Modification 2 of Embodiment 1 of the present disclosure in the order of steps. Step ST2 illustrated in FIG. 14 is the same as step ST2 of FIG. 4. In the method for manufacturing the vertical MOSFET 1B, Si is ion implanted into the source forming region 18' at step ST2, and then processing proceeds to step ST2-1 of FIG. 14.

At step ST2-1, the manufacturing equipment forms a mask M6 that exposes the top of a region where the JFET region 15 is to be formed (hereinafter referred to as JFET forming region 15') and covers the tops of the other regions on the front surface 10a of the GaN substrate 10. Next, the manufacturing equipment ion implants Si as a donor element into the front surface 10a of the GaN substrate 10 formed with the mask M6. In this ion implantation step, the dosage of Si is set so that the Si concentration in the JFET region 15 is, for example, $1E+17$ cm$^{-3}$.

The mask M6 is, for example, a resist pattern. After the ion implantation, the manufacturing equipment removes the mask M6 from the GaN substrate 10. After that, processing proceeds to step ST3 of FIG. 5. Steps after step ST3 are the same as those in the method for manufacturing the vertical MOSFET 1 described above. At step ST4 of FIG. 5, heat treatment activates the Si ion implanted into the JFET forming region 15' to form the JFET region 15. The vertical MOSFET 1B is completed through such steps.

Embodiment 2

Embodiment 1 above has described the formation of each of the P-type first well region 131 and P+-type second well region 132 by ion implantation. However, in embodiments of the present disclosure, the method for forming the first well region 131 and the second well region 132 is not limited to ion implantation. The first and second well regions 131 and 132 may be formed by an epitaxial growth process.

Figure 15:
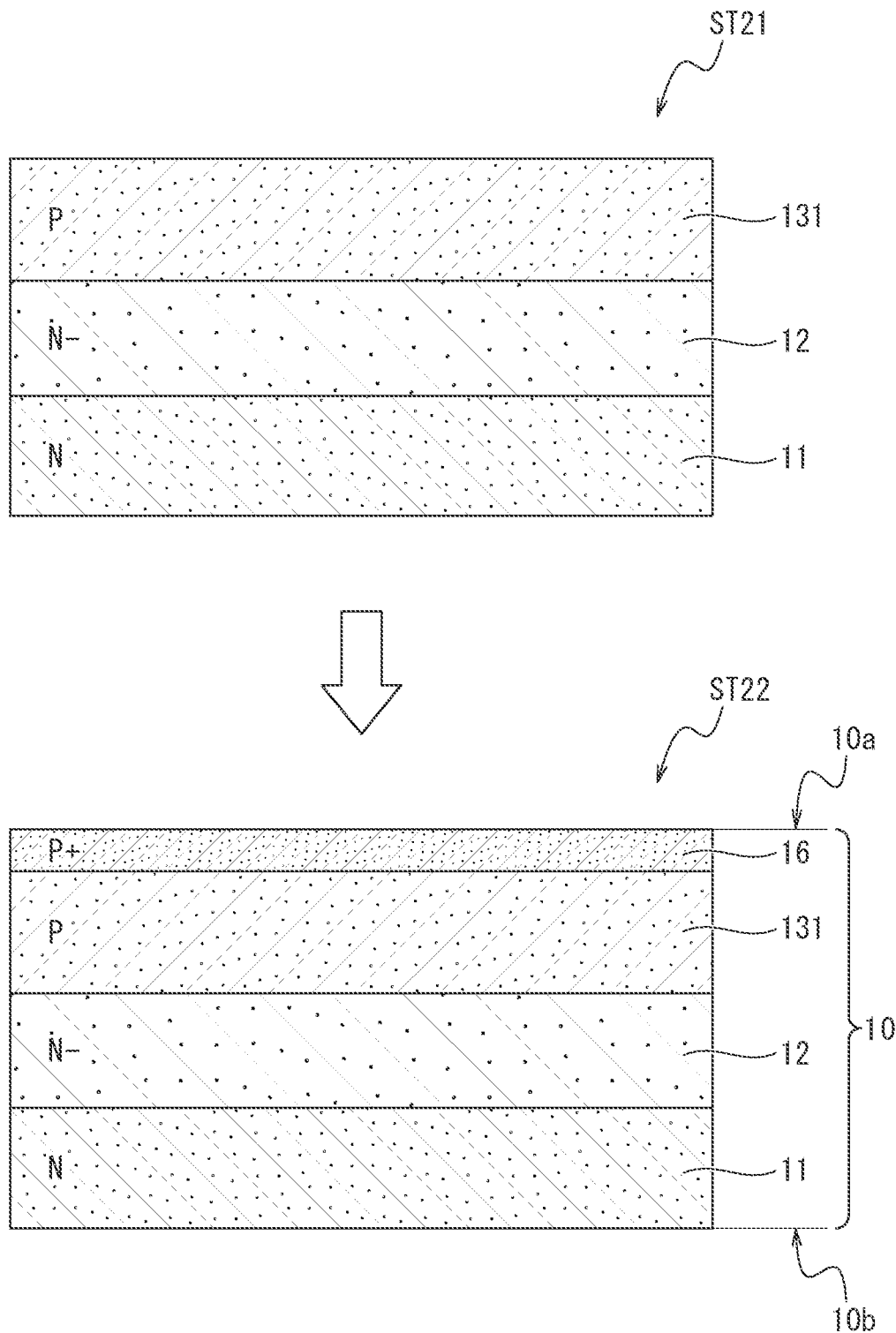
FIG. 15 is a cross-sectional view illustrating a method for manufacturing a vertical MOSFET according to Embodiment 2 of the present disclosure in the order of steps.
Figure 16:
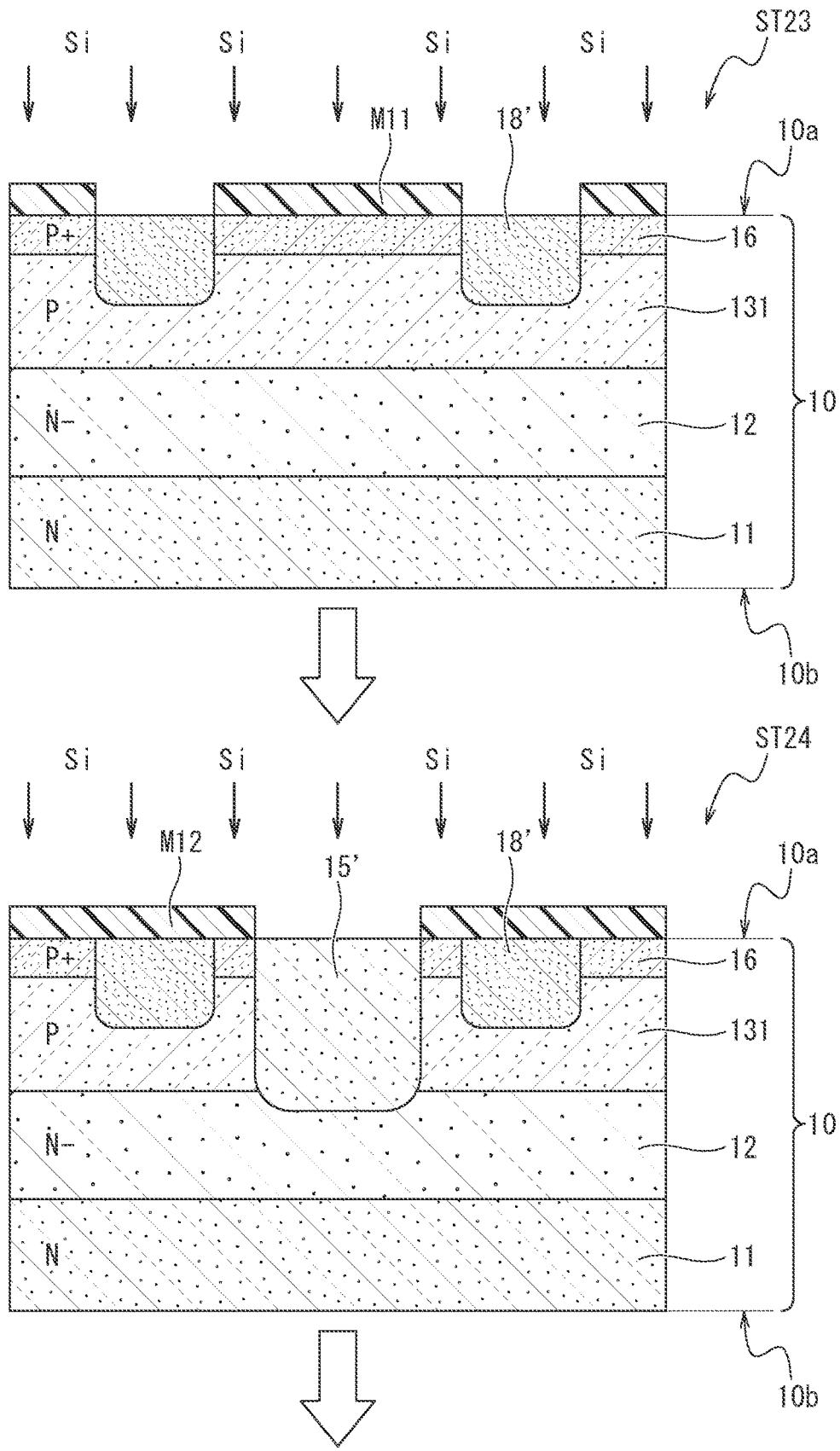
FIG. 16 is a cross-sectional view illustrating the method for manufacturing the vertical MOSFET according to Embodiment 2 of the present disclosure in the order of steps.
Figure 17:
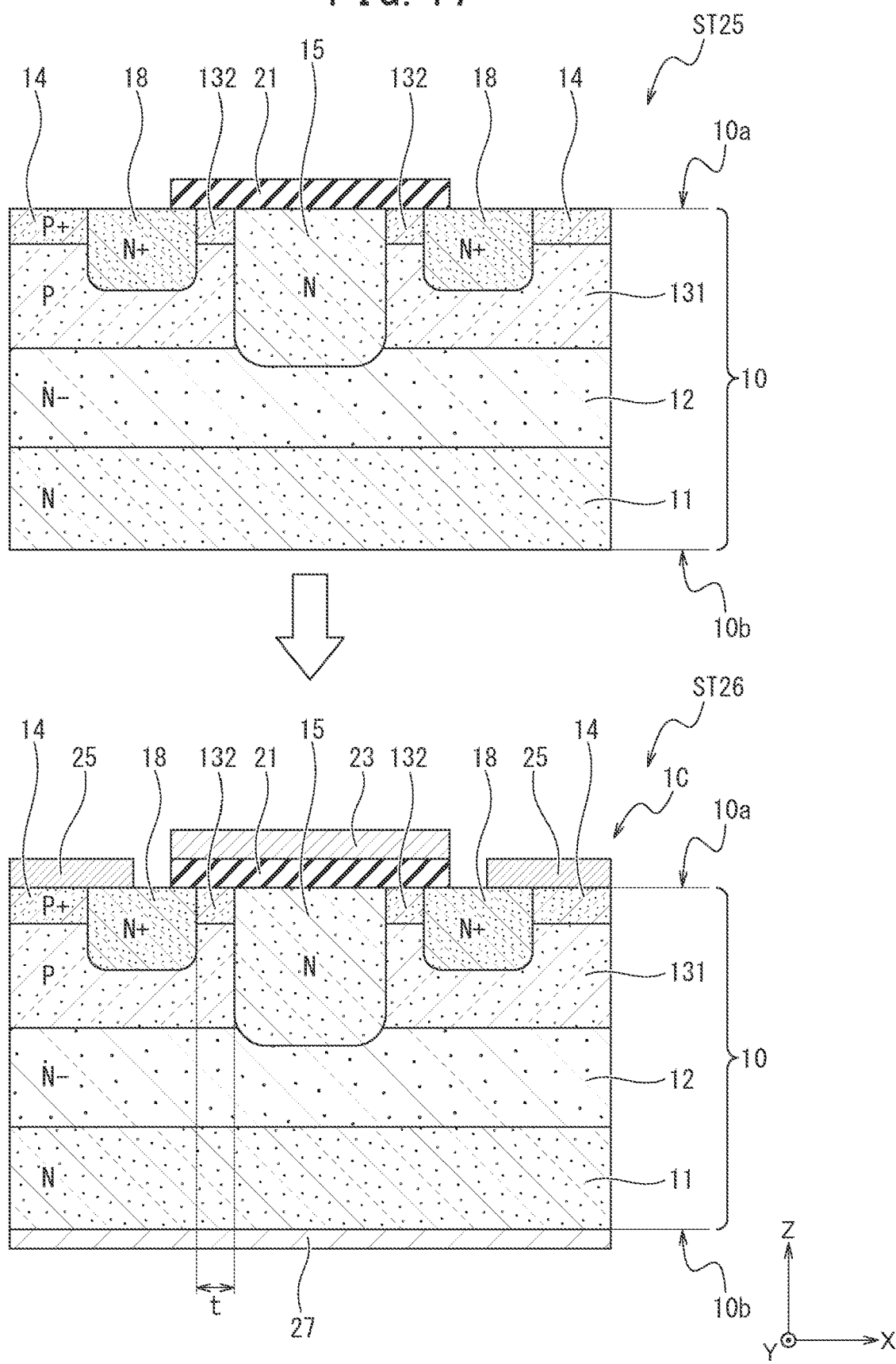
FIG. 17 is a cross-sectional view illustrating the method for manufacturing the vertical MOSFET according to Embodiment 2 of the present disclosure in the order of steps.

FIGS. 15 to 17 are cross-sectional views illustrating a method for manufacturing a vertical MOSFET 1C according to Embodiment 2 of the present disclosure in the order of steps. As illustrated in step ST21 of FIG. 15, the manufacturing equipment forms the N−-type GaN layer (drift region) 12 and the P-type GaN layer (first well region) 131 in this order on the N-type GaN monocrystalline substrate 11 by an epitaxial growth process.

Next, as illustrated in step ST22 of FIG. 15, the manufacturing equipment forms a P+-type GaN layer 16 on the P-type GaN layer (first well region) 131 by an epitaxial growth process. Acceptor element (for example, Mg) concentration in the P+-type GaN layer 16 is, for example, $3E+18$ cm$^{-3}$. Thickness of the Pt-type GaN layer 16 from the front surface 10a is, for example, 5 nm. After forming the P-type GaN layer (first well region) 131, the manufacturing equipment may subsequently grow the P+-type GaN layer 16 without releasing a chamber inside to the air.

Next, as illustrated in step ST23 of FIG. 16, the manufacturing equipment forms a mask M11 that exposes the top of each source forming region 18' and covers the tops of the other regions on the front surface 10a of the GaN substrate 10, and ion implants Si as a donor element into the GaN substrate 10 formed with the mask M11. The mask M11 is, for example, a resist pattern. After the ion implantation, the manufacturing equipment removes the mask M11 from the GaN substrate 10.

Next, as illustrated in step ST24 of FIG. 16, the manufacturing equipment forms a mask M12 that exposes the top of the JFET forming region 15' and covers the tops of the other regions on the front surface 10a of the GaN substrate 10. Then, the manufacturing equipment ion implants Si as a donor element into the GaN substrate 10 formed with the mask M12. In this ion implantation step, the dosage of Si is set so that the Si concentration in the JFET region 15 is, for example, 1E+17 cm$^{-3}$. The mask M12 is, for example, a resist pattern. After the ion implantation, the manufacturing equipment removes the mask M12 from the GaN substrate 10.

Next, the manufacturing device forms a protective film (not illustrated) on the front surface 10a of the GaN substrate 10, and performs heat treatment on the GaN substrate formed with the protective film. The heat treatment activates the Si ion implanted into the GaN substrate 10. As a result, as illustrated in step ST25 of FIG. 17, the N$^+$-type source region 18 and the N-type JFET region 15 are formed on the GaN substrate 10. Additionally, the heat treatment can recover defects caused by the ion implantation of Mg and Si in the GaN substrate 10 to some extent. After the heat treatment, the manufacturing equipment removes the protective film from the GaN substrate 10.

In addition, in the Pt-type GaN layer 16, a region sandwiched by the JFET forming region 15' and the source forming region 18' is the P$^+$-type second well region 132. Furthermore, in the P$^+$-type GaN layer 16, a region located on an opposite side of the second well region 132 across the source region 18 (i.e., the region sandwiched from both sides by the source region 18) is the P$^+$-type contact region 14. In other words, the second well region 132 and the contact region 14 are configured by the GaN layer 16 formed by epitaxial growth processing.

Steps thereafter are the same as those in Embodiment 1. The manufacturing equipment forms the gate insulating film 21 on the front surface 10a of the GaN substrate 10. For example, the manufacturing equipment forms an SiO$_2$ film as the gate insulating film 21 to a thickness of 100 nm by a plasma CVD process.

Next, as illustrated in step ST26 of FIG. 17, the manufacturing equipment forms the gate electrode 23 and the source electrode 25 on the front surface 10a side of the GaN substrate 10. Additionally, the manufacturing equipment forms the drain electrode 27 on the back surface 10b of the GaN substrate 10. The vertical MOSFET 1C according to Embodiment 2 is completed through such steps.

In Embodiment 2, the second well region 132 is formed not by ion implantation but by an epitaxial growth process. Therefore, the acceptor concentration (for example, Mg concentration) in the second well region 132 can be uniformed in a thickness direction thereof. The thickness direction of the second well region 132 is the normal direction of the interface between the well region 13 and the gate insulating film 21, and is the Z-axis direction even in Embodiment 2.

Effects of Embodiment 2

Embodiment 2 achieves the same effects as those of Embodiment 1. The vertical MOSFET 1C according to Embodiment 2 can reduce hole traps at the interface between the P$^+$-type second well region 132 and the gate insulating film 21, enabling suppression of channel mobility reduction and variation in the threshold voltage Vth due to the hole traps. In addition, since a channel is formed in the layered structure of the P$^+$-type second well region 132 and the P-type first well region 131, the threshold voltage Vth can be easily controlled to a desired value.

Furthermore, the vertical MOSFET 1C includes the N-type JFET region 15 higher in donor concentration (for example, Si concentration) than the N$^-$-type drift region 12. This enables reduced on-resistance.

Embodiment 3

Embodiment 1 above has described the formation of each of the P-type first well region 131 and the P$^+$-type second well region 132 by ion implantation. Embodiment 2 above has described the formation of each of the P-type first well region 131 and the P$^+$-type second well region 132 by epitaxial growing. However, in embodiments of the present disclosure, formation of the first and second well regions 131 and 132 is not limited to those described above. The first well region 131 may be formed by an epitaxial growth process, and the second well region 132 by ion implantation.

Figure 18:
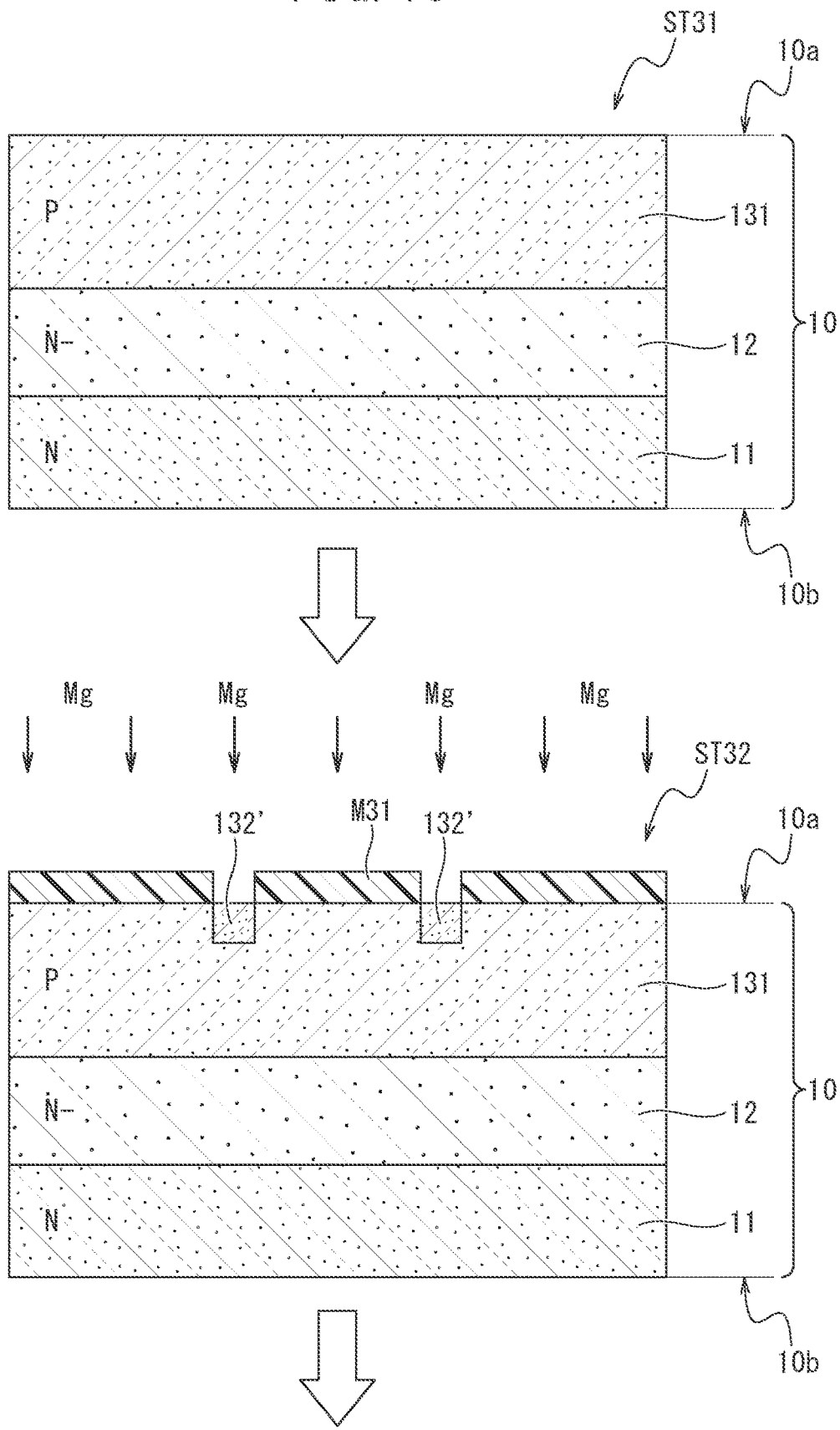
FIG. 18 is a cross-sectional view illustrating a method for manufacturing a vertical MOSFET according to Embodiment 3 of the present disclosure in the order of steps.
Figure 19:
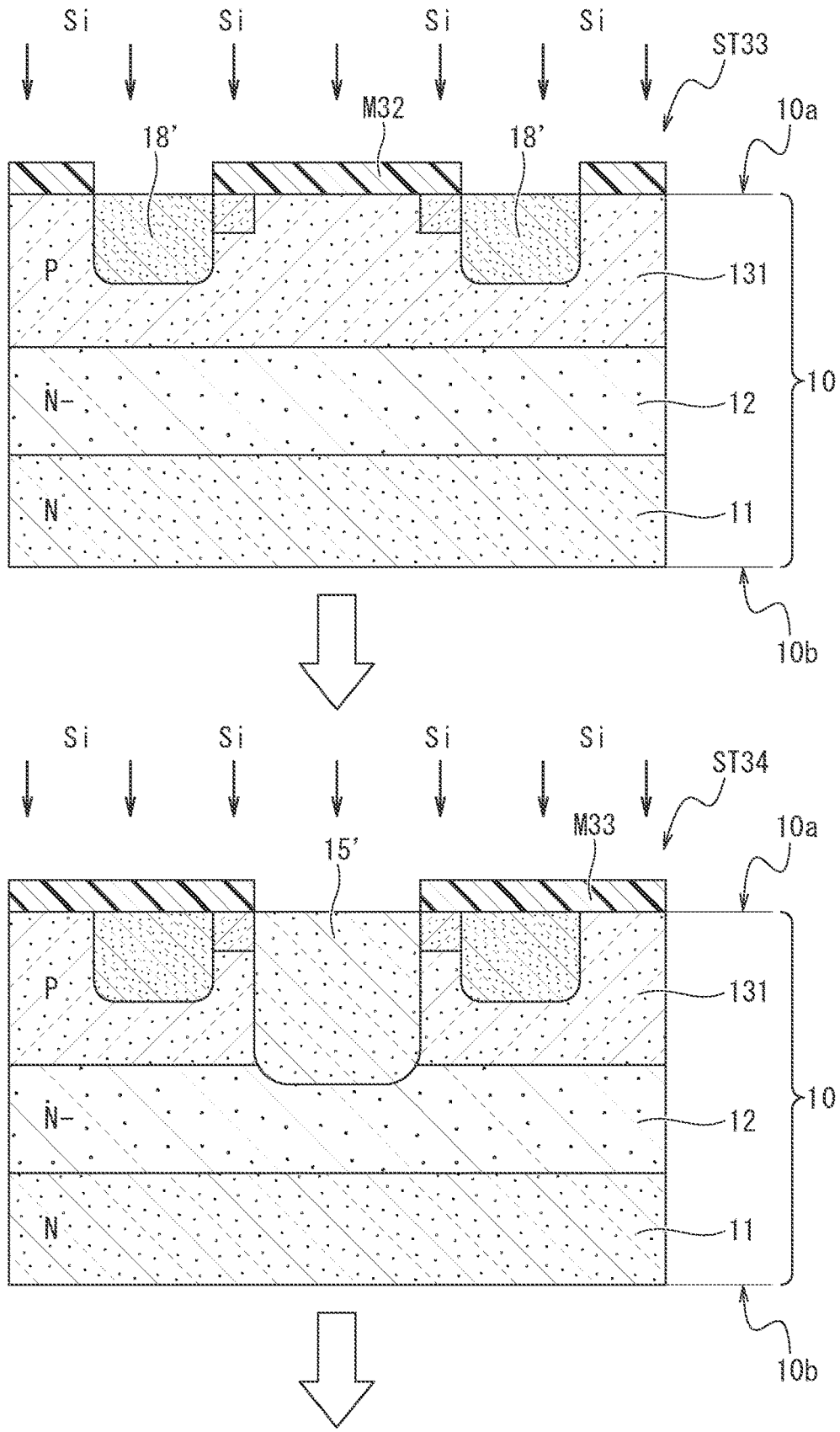
FIG. 19 is a cross-sectional view illustrating the method for manufacturing the vertical MOSFET according to Embodiment 3 of the present disclosure in the order of steps.
Figure 20:
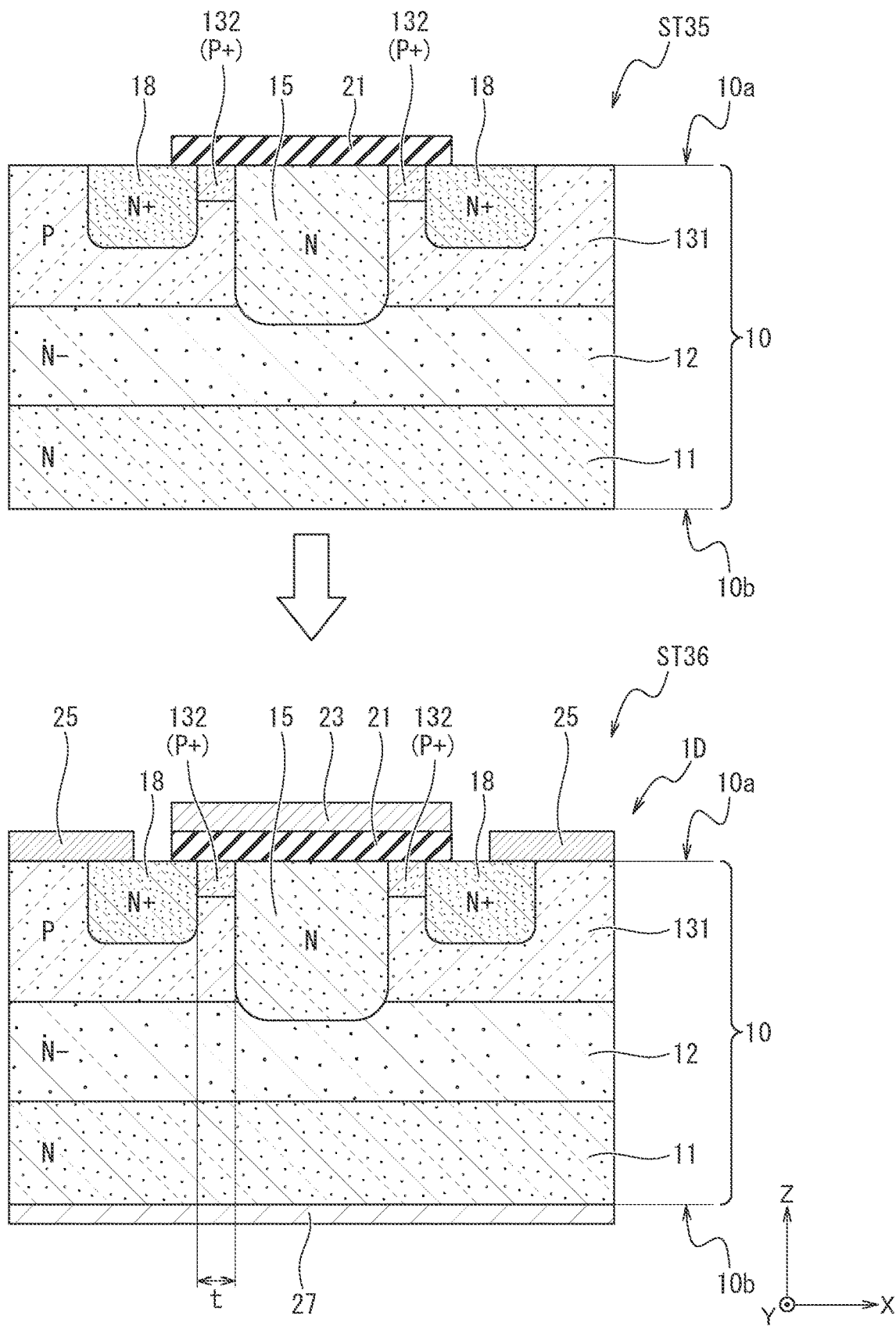
FIG. 20 is a cross-sectional view illustrating the method for manufacturing the vertical MOSFET according to Embodiment 3 of the present disclosure in the order of steps.

FIGS. 18 to 20 are cross-sectional views illustrating a method for manufacturing a vertical MOSFET 1D according to Embodiment 3 of the present disclosure in the order of steps. As illustrated in step ST31 of FIG. 18, the manufacturing equipment forms the N$^-$-type GaN layer (drift region) 12 and the P-type GaN layer (first well region) 131 in this order on the N-type GaN monocrystalline substrate 11 by an epitaxial growth process.

Next, as illustrated in step ST32 of FIG. 18, the manufacturing equipment forms a mask M31 that exposes the top of each second well forming region 132' and covers the tops of the other regions on the front surface 10a of the GaN substrate 10, and ion implants Mg as an acceptor element into the GaN substrate 10 formed with the mask M31. In this ion implantation step, the dosage of Mg is set so that the Mg concentration in the second well region 132 is, for example, 3E+18 cm$^{-3}$. The mask M31 is, for example, a resist pattern. After the ion implantation, the manufacturing equipment removes the mask M31 from the GaN substrate 10.

Then, as illustrated in step ST33 of FIG. 19, the manufacturing equipment forms a mask M32 that exposes the top of each source forming region 18' and covers the tops of the other regions on the front surface 10a of the GaN substrate and ion implants Si as a donor element into the GaN substrate 10 formed with the mask M32. In this ion implantation step, the dosage of Si is set so that the Si concentration in the source region 18 is, for example, 1E+19 cm$^{-3}$. The mask M32 is, for example, a resist pattern. After the ion implantation, the manufacturing equipment removes the mask M32 from the GaN substrate 10.

Next, as illustrated in step ST34 of FIG. 19, the manufacturing equipment forms a mask M33 that exposes the top of the JFET forming region 15' and covers the tops of the other regions on the front surface 10a of the GaN substrate 10. Then, the manufacturing equipment ion implants Si as a donor element into the GaN substrate 10 formed with the mask M33. In this ion implantation step, the dosage of Si is set so that the Si concentration in the JFET region 15 is, for example, 1E+17 cm$^{-3}$. The mask M33 is, for example, a resist pattern. After the ion implantation, the manufacturing equipment removes the mask M33 from the GaN substrate 10.

Next, the manufacturing equipment forms a protective film (not illustrated) on the front surface 10a of the GaN substrate 10, and performs heat treatment on the GaN substrate formed with the protective film. The heat treatment activates the Mg and Si ion implanted into the GaN substrate As a result, as illustrated in step ST35 of FIG. 20, the P$^+$-type second well region 132, the N$^+$-type source region 18, and the N-type JFET region 15 are formed on the GaN substrate 10. Additionally, the heat treatment can recover defects caused by the ion implantation of Mg and Si in the GaN substrate to some extent. After the heat treatment, the manufacturing equipment removes the protective film from the GaN substrate 10.

Steps thereafter are the same as those of Embodiment 1. The manufacturing equipment forms the gate insulating film 21 on the front surface 10$a$ of the GaN substrate 10. For example, the manufacturing equipment forms an SiO$_2$ film as the gate insulating film 21 to a thickness of 100 nm by a plasma CVD process.

Next, as illustrated in step ST36 of FIG. 20, the manufacturing equipment forms the gate electrode 23 and the source electrode 25 on the front surface 10$a$ side of the GaN substrate 10. Additionally, the manufacturing equipment forms the drain electrode 27 on the back surface 10$b$ of the GaN substrate 10. The vertical MOSFET 1D according to Embodiment 3 is completed through such steps.

Effects of Embodiment 3

Embodiment 3 achieves the same effects as those of Embodiment 2. The vertical MOSFET 1D according to Embodiment 3 can reduce hole traps at the interface between the P$^+$-type second well region 132 and the gate insulating film 21, enabling suppression of channel mobility reduction and variation in the threshold voltage Vth due to the hole traps. Additionally, since a channel is formed in the layered structure of the P$^+$-type second well region 132 and the P-type first well region 131, the threshold voltage Vth can be easily controlled to a desired value. Furthermore, the vertical MOSFET 1D includes the N-type JFET region 15, therefore enabling reduced on-resistance.

Modification

Even in the vertical MOSFET 1D according to Embodiment 3, Modification 1 of Embodiment 1 may be applied. In other words, the vertical MOSFET 1D may include the P$^+$-type contact region 14 (see FIG. 10). The P$^+$-type contact region 14 may be formed simultaneously in the same step as the P$^+$-type second well region 132 or separately from the P$^+$-type second well region 132, as described with reference to FIGS. 11 and 12. The P$^+$-type contact region 14 can further increase ohmic properties of connection between the source electrode 25 and the P-type first well region 131.

Embodiment 4

Embodiments 1 to 3 above have described the well region 13 including the first well region 131 and the second well region 132. However, in embodiments of the present disclosure, the configuration of the well region 13 is not limited thereto. In embodiments of the present disclosure, the well region may further include a third well region higher in acceptor element concentration than the first well region on an opposite side of the second well region across the first well region.

Configuration Example

Figure 21:
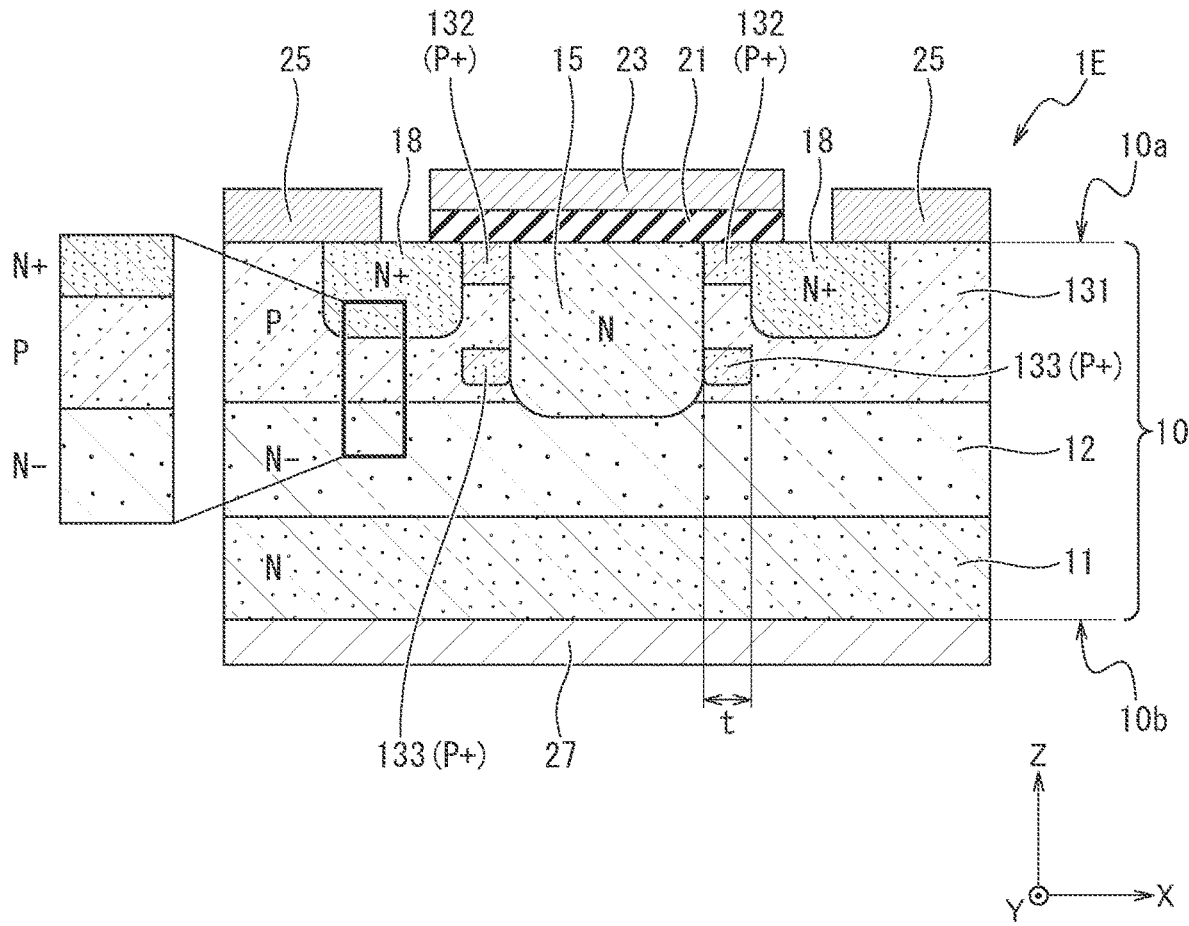
FIG. 21 is a cross-sectional view illustrating a configuration example of a vertical MOSFET according to Embodiment 4 of the present disclosure.

FIG. 21 is a cross-sectional view illustrating a configuration example of a vertical MOSFET 1E according to Embodiment 4 of the present disclosure. As illustrated in FIG. 21, in the vertical MOSFET 1E according to Embodiment 4, the P-type well region 13 includes the P-type first well region 131, the P$^+$-type second well region 132, and a P$^+$-type third well region 133 provided on the opposite side of the second well region 132 across the first well region 131 (i.e., in a position deeper than the second well region 132 via the first well region 131). Acceptor element (for example, Mg) concentration in the third well region 133 is from 5E+17 cm$^{-3}$ to below 1E+19 cm$^{-3}$. One example is 3E+18 cm$^{-3}$. Mg concentration of the third well region 133 may be the same as that of the second well region 132.

The vertical MOSFET 1E is an embodiment in which the third well region 133 is added to the vertical MOSFET 1 according to Embodiment 1 (see FIG. 3), and corresponds to an application example of Embodiment 1.

(Manufacturing Method)

Figure 22:
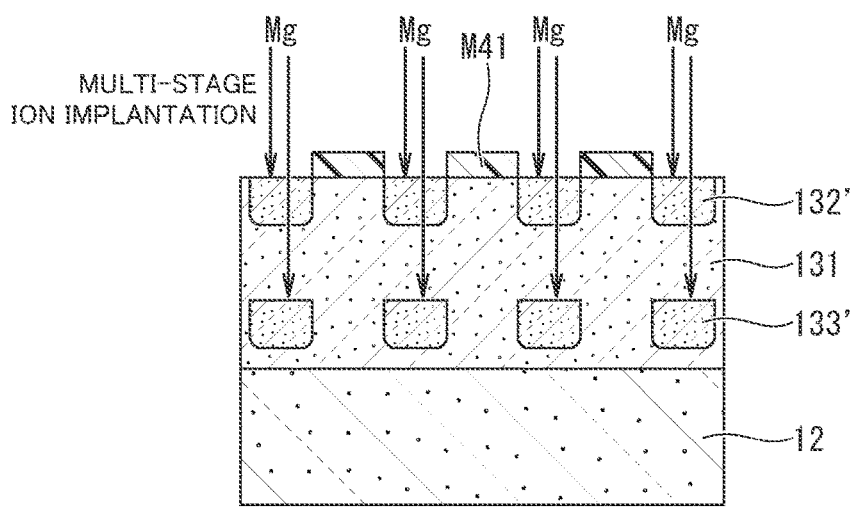
FIG. 22 is a cross-sectional view illustrating one step of a method for manufacturing the vertical MOSFET according to Embodiment 4 of the present disclosure.

FIG. 22 is a cross-sectional view illustrating one step of a method for manufacturing the vertical MOSFET 1E according to Embodiment 4 of the present disclosure. As illustrated in FIG. 22, the manufacturing equipment forms a mask M41 that exposes the top of each second well forming region 132' and covers the tops of the other regions on the front surface 10$a$ of the GaN substrate 10, and performs multi-stage ion implantation of Mg as an acceptor element into the GaN substrate 10 formed with the mask M41. As a result, Mg can be introduced into the second well forming region 132' and each region where the third well region 133 located deeper from the front surface 10$a$ of the GaN substrate 10 than the second well forming region 132' is to be formed (hereinafter referred to as third well forming region 133'). After performing the multi-stage ion implantation of Mg as described above, the manufacturing equipment forms a protective film (not illustrated) on the front surface 10$a$ of the GaN substrate 10, and performs heat treatment to activate the Mg ion implanted in multiple stages. This allows for formation of the second well region 132 and the third well region 133, as illustrated in FIG. 21.

Effects of Embodiment 4

Embodiment 4 achieves the same effects as those of Embodiments 2 and 3. The vertical MOSFET 1E according to Embodiment 4 can reduce hole traps at the interface between the P$^+$-type second well region 132 and the gate insulating film 21, enabling suppression of channel mobility reduction and variation in the threshold voltage Vth due to the hole traps. Additionally, a channel is formed in the layered structure of the P$^+$-type second well region 132 and the P-type first well region 131, thus facilitating control of the threshold voltage Vth to a desired value. Furthermore, since the vertical MOSFET 1E includes the N-type JFET region 15, on-resistance can be reduced.

In addition, the well region 13 of the vertical MOSFET 1E further includes the P$^+$-type third well region 133 higher in acceptor element concentration (for example, Mg concentration) than the first well region 131 on the opposite side of the second well region 132 across the first well region 131. This can effectively increase the Mg concentration of the well region 13, enabling resistance of the well region 13 to be effectively reduced. As a result, as illustrated in FIG. 21, drive of an NPN bipolar transistor configured by the N$^-$-type drift region 12, the P-type well region 13, and the N$^+$-type source region 18 can be suppressed. Since a depletion layer in a gate-off state easily spreads toward the drift region 12, breakdown voltage of the vertical MOSFET 1E can be further increased.

Modification 1

Embodiment 4 above has described the formation of the third well region by ion implantation. However, the method for forming the third well region is not limited thereto. The third well region may be formed by an epitaxial growing process.

Figure 23:
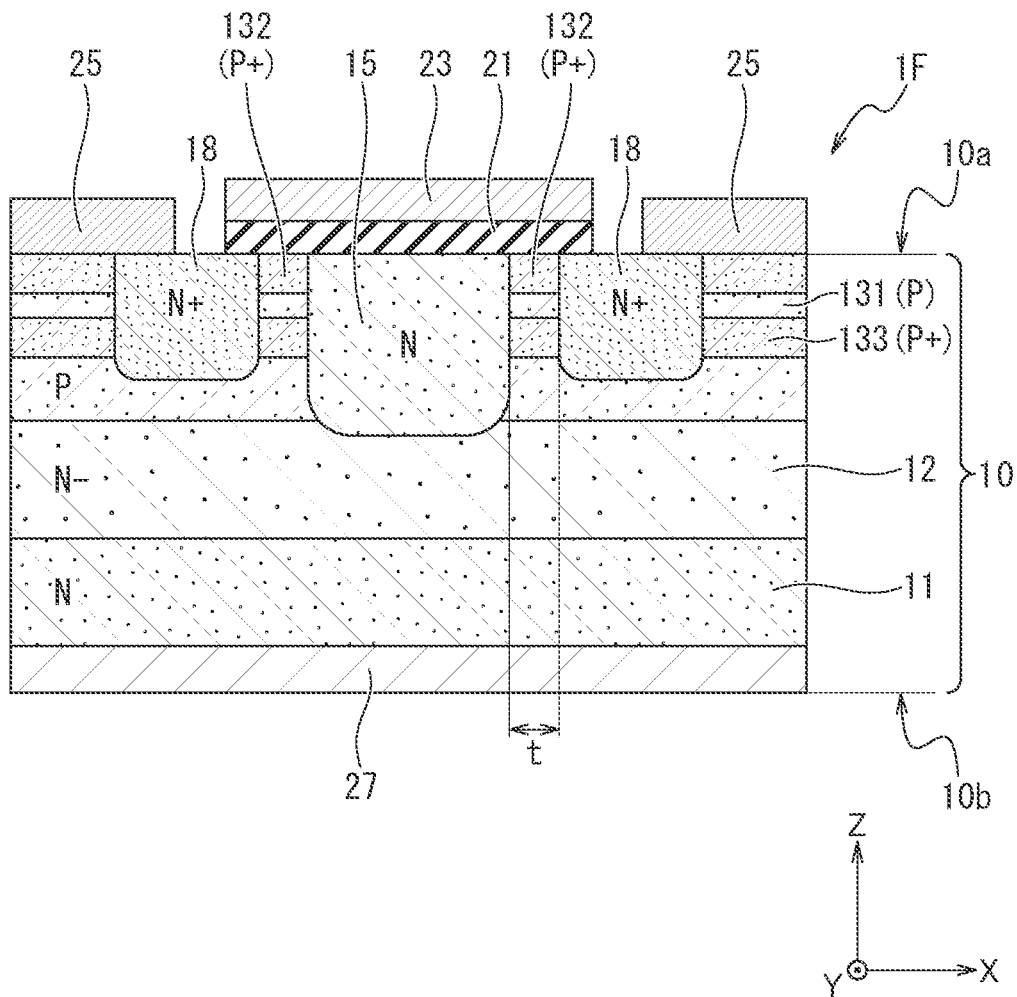
FIG. 23 is a cross-sectional view illustrating a vertical MOSFET according to Modification 1 of Embodiment 4 of the present disclosure.

FIG. 23 is a cross-sectional view illustrating a vertical MOSFET 1F according to Modification 1 of Embodiment 4 of the present disclosure. As illustrated in FIG. 23, in the vertical MOSFET 1F according to Modification 1 of Embodiment 4, the P-type well region 13 includes the P-type first well region 131, the P$^+$-type second well region 132, and the P$^+$-type third well region 133 provided on the opposite side of the second well region 132 across the first well region 131 (i.e., in a position deeper than the second well region 132 via the first well region 131). The third well region 133 is a P$^+$-type GaN layer formed by an epitaxial growth process. The third well region 133 is formed not only below the second well region 132 but also below the P$^+$-type contact region 14.

The vertical MOSFET 1F is an embodiment in which the third well region 133 is added to the vertical MOSFET 1C according to Embodiment 2 (see FIG. 17), and corresponds to an application example of Embodiment 2.

Figure 24:
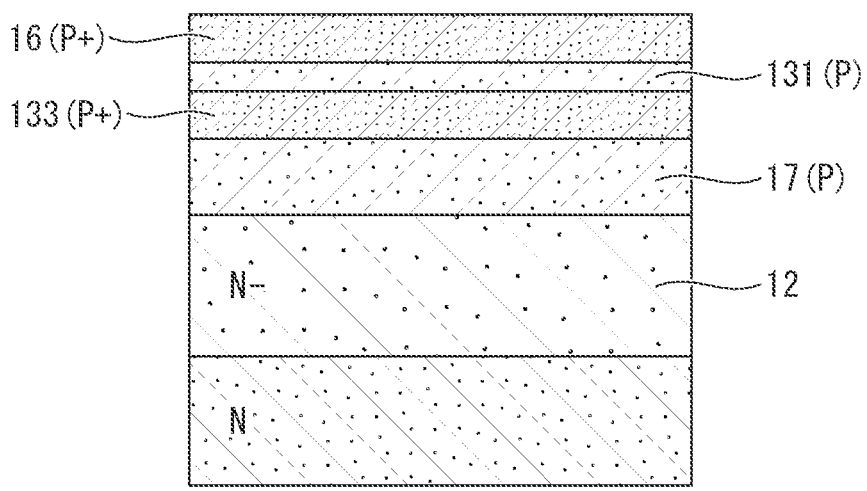
FIG. 24 is a cross-sectional view illustrating one step of a method for manufacturing the vertical MOSFET according to Modification 1 of Embodiment 4 of the present disclosure.

FIG. 24 is a cross-sectional view illustrating one step of a method for manufacturing the vertical MOSFET 1F according to Modification 1 of Embodiment 4 of the present disclosure. As illustrated in FIG. 24, the manufacturing equipment forms the N$^-$-type GaN layer (drift region) 12, a P-type GaN layer 17, the P$^+$-type GaN layer (third well region) 133, the P-type GaN layer (first well region) 131, and the P$^+$-type GaN layer 16 in this order on the N-type GaN monocrystalline substrate 11 by an epitaxial growth process. The P$^+$-type second well region 132 and the Pt-type contact region 14 illustrated in FIG. 23 are configured by the P$^+$-type GaN layer 16.

Modification 2

In the above vertical MOSFETs 1E and 1F, the third well region 133 may be extended from below the second well region 132 to below the source region 18.

Figure 25:
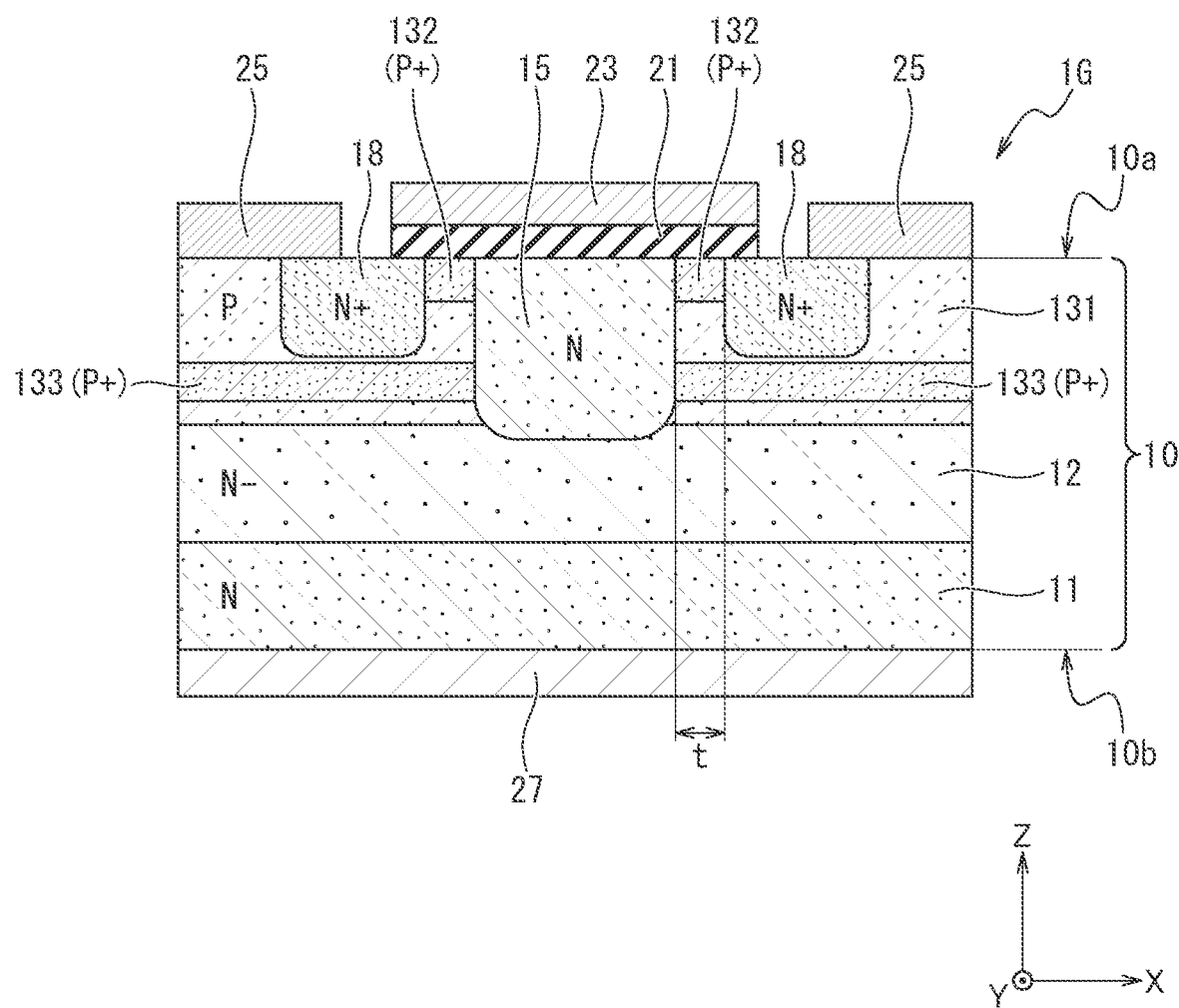
FIG. 25 is a cross-sectional view illustrating a vertical MOSFET according to Modification 2 of Embodiment 4 of the present disclosure.

FIG. 25 is a cross-sectional view illustrating a vertical MOSFET 1G according to Modification 2 of Embodiment 4 of the present disclosure. As illustrated in FIG. 25, in the vertical MOSFET 1G according to Modification 2 of Embodiment 4, the third well region 133 is extended from below the second well region 132 through below the source region 18 to below the contact region 14.

Figure 28:
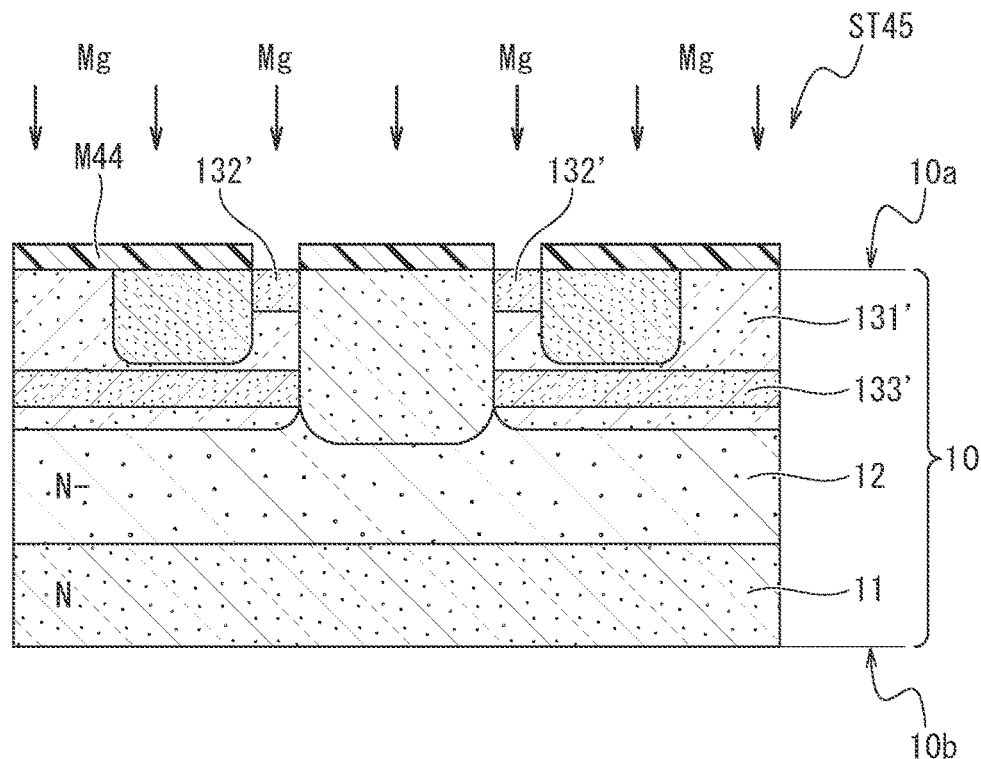
FIG. 28 is a cross-sectional view illustrating the method for manufacturing the vertical MOSFET according to Modification 2 of Embodiment 4 of the present disclosure in the order of steps.

FIGS. 26 to 28 are cross-sectional views illustrating a method for manufacturing the vertical MOSFET 1G according to Modification 2 of Embodiment 4 of the present disclosure in the order of steps. As illustrated in step ST41 of FIG. 26, the manufacturing equipment performs ion implantation for forming the first well region 131 (see FIG. 25). For example, the manufacturing equipment forms a mask M41 that exposes the top of each first well forming region 131' and covers the top of the other region on the front surface 10a of the GaN substrate 10, and ion implants Mg as an acceptor element into the GaN substrate 10 formed with the mask M41. In this ion implantation step, the dosage of Mg is set so that the Mg concentration in the first well forming region 131' is, for example, 1E+17 cm$^{-3}$.

Next, as illustrated in step ST42 of FIG. 26, the manufacturing equipment performs ion implantation for forming the third well region 133 (see FIG. 25). For example, on a planar view from a normal direction of the front surface of the GaN substrate, the first well forming region 131' coincides with the third well forming region 133'. Therefore, the manufacturing equipment uses the mask M41 used at step ST41 as it is to ion implant Mg as an acceptor element into the GaN substrate 10. In this ion implantation step, the dosage of Mg is set so that the Mg concentration in the third well forming region 133' is, for example, 3E+18 cm$^{-3}$.

In the ion implantation step of step ST42, Mg is ion implanted at a higher dosage and a higher implantation energy (acceleration energy) than step ST41. The mask M41 is, for example, a resist pattern. After the ion implantation at step ST42, the manufacturing equipment removes the mask M41 from the GaN substrate 10.

Next, as illustrated in step ST43 of FIG. 27, the manufacturing equipment forms a mask M42 that exposes the top of each source forming region 18' and covers the tops of the other regions on the front surface 10a of the GaN substrate and ion implants Si as a donor element into the GaN substrate 10 formed with the mask M42. In this ion implantation step, the dosage of Si is set so that the Si concentration in the source forming region 18' is, for example, 1E+19 cm$^{-3}$. The mask M42 is, for example, a resist pattern. After the ion implantation, the manufacturing equipment removes the mask M42 from the GaN substrate 10.

Next, as illustrated in step ST44 of FIG. 27, the manufacturing equipment forms a mask M43 that exposes the top of the JFET forming region 15' and covers the tops of the other regions on the front surface 10a of the GaN substrate 10. Then, the manufacturing equipment ion implants Si as a donor element into the GaN substrate 10 formed with the mask M43. In this ion implantation step, the dosage of Si is set so that the Si concentration in the JFET region 15 is, for example, 1E+17 cm$^{-3}$. The mask M43 is, for example, a resist pattern. After the ion implantation, the manufacturing equipment removes the mask M43 from the GaN substrate 10.

Next, as illustrated in step ST45 of FIG. 28, the manufacturing equipment forms a mask M44 that exposes the top of each second well forming region 132' and covers the tops of the other regions on the front surface 10a of the GaN substrate 10, and ion implants Mg as an acceptor element into the GaN substrate 10 formed with the mask M44. In this ion implantation step, the dosage of Mg is set so that the Mg concentration in the second well region 132 is, for example, 3E+18 cm$^{-3}$. The mask M44 is, for example, a resist pattern. After the ion implantation, the manufacturing equipment removes the mask M44 from the GaN substrate 10.

Steps thereafter are the same as those of Embodiment 1. The manufacturing equipment forms a protective film (not illustrated) on the front surface 10a of the GaN substrate 10, and performs heat treatment on the GaN substrate 10 formed with the protective film. The heat treatment activates the Si and Mg ion implanted into the GaN substrate 10 to form the N$^+$-type source region 18, the N-type JFET region 15, the P$^+$-type second well region 132, and the P$^+$-type third well region 133. After the heat treatment, the manufacturing equipment removes the protective film from the GaN substrate Next, the manufacturing equipment forms the gate insulating film 21 on the front surface 10a of the GaN substrate 10. For example, the manufacturing equipment forms an SiO$_2$ film as the gate insulating film 21 to a thickness of 100 nm by a plasma CVD process. Then, the manufacturing equipment forms the gate electrode 23 and the source electrode 25 on the front surface 10a side of the GaN substrate 10. Additionally, the manufacturing equipment forms the drain electrode 27 on the back surface 10b of the GaN substrate 10. The vertical MOSFET 1G according to Modification 2 of Embodiment 4 is completed through such steps.

Embodiment 5

The above embodiments have described the case where the vertical MOSFET according to the embodiments of the present disclosure is of a planar gate type. However, the vertical MOSFET according to embodiments of the present disclosure is not limited to planar type. The vertical MOSFET according to embodiments of the present disclosure may be, for example, of a trench gate type.

Configuration Example

Figure 29:
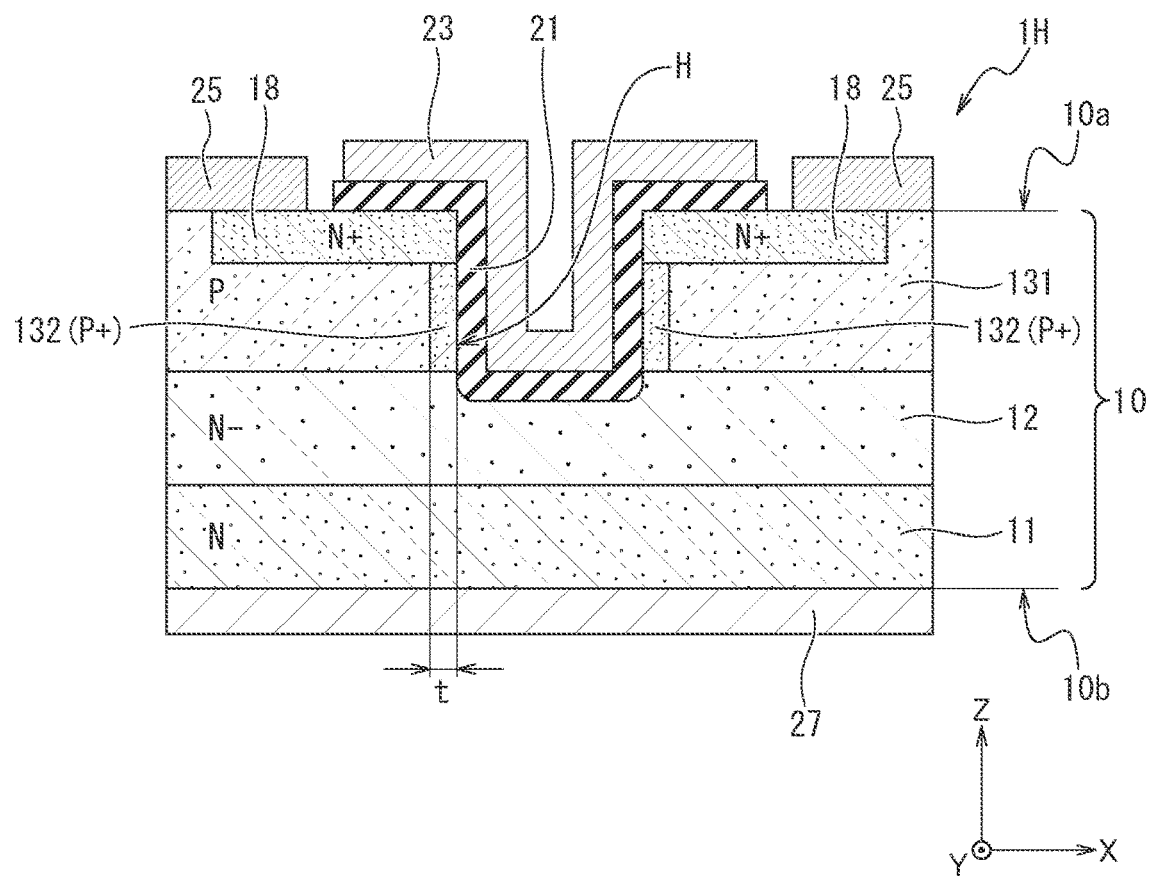
FIG. 29 is a cross-sectional view illustrating a configuration example of a vertical MOSFET according to Embodiment 5 of the present disclosure.

FIG. 29 is a cross-sectional view illustrating a configuration example of a vertical MOSFET 1H according to Embodiment 5 of the present disclosure. As illustrated in FIG. 29, the vertical MOSFET 1H includes a trench H provided in the GaN substrate 10. The trench H opens on the front surface 10a side of the GaN substrate 10, and a bottom portion thereof reaches the N$^-$-type drift region 12. The P$^+$-type second well region 132 faces side surfaces of the trench H. The gate insulating film 21 and the gate electrode 23 are arranged in the trench H. The side surfaces of the trench H are provided with the gate insulating film 21.

In the vertical MOSFET 1H, the normal direction of the interface between the second well region 132 and the gate insulating film 21 is, for example, the X-axis direction. The thickness t of the second well region 132 in the normal direction (X-axis direction) of the interface is, for example, from 1 nm to 90 nm, and one example is 5 nm.

(Manufacturing Method)

Figure 30:
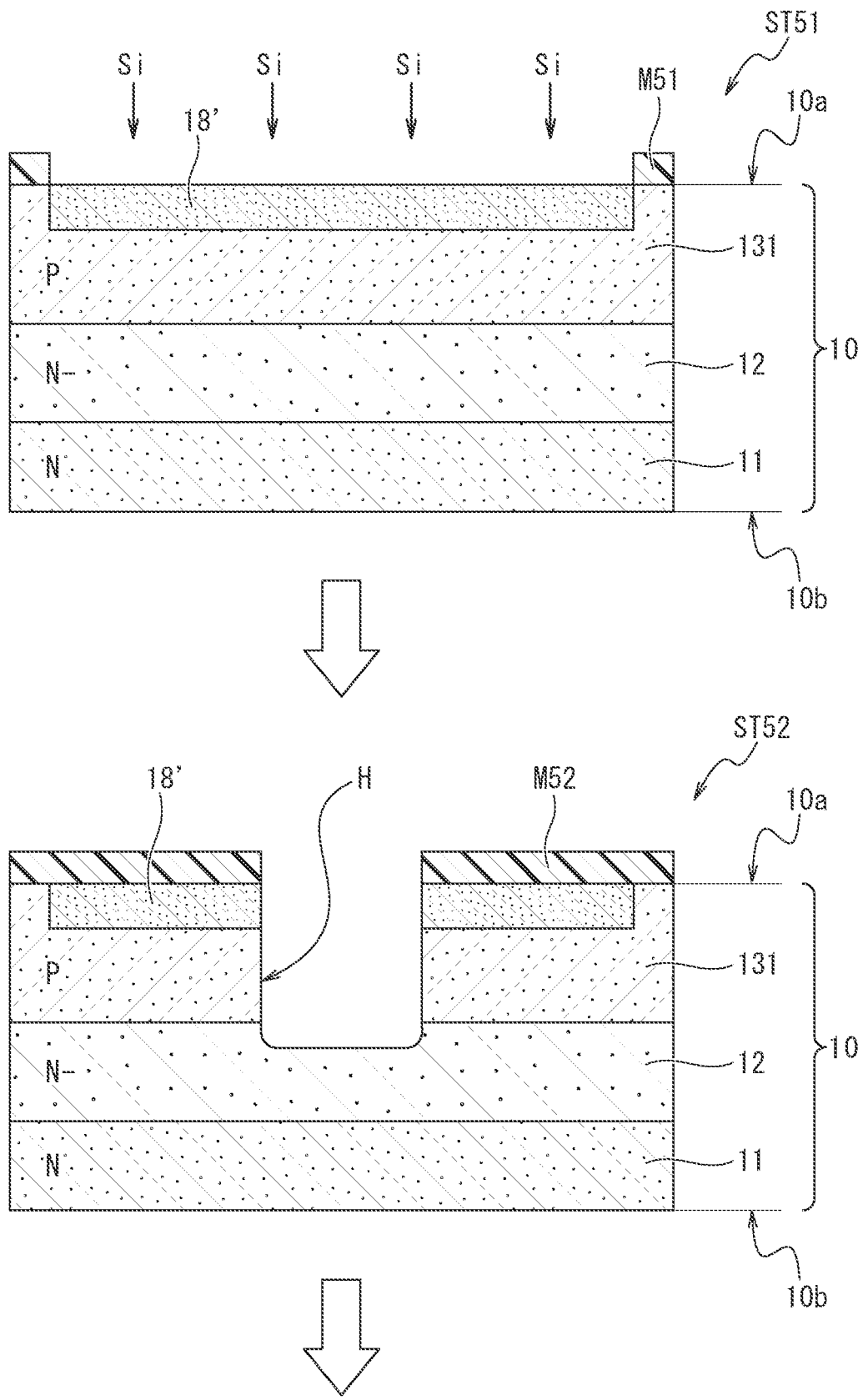
FIG. 30 is a cross-sectional view illustrating a method for manufacturing the vertical MOSFET according to Embodiment 5 of the present disclosure in the order of steps.

Next, a description is given of a method for manufacturing the vertical MOSFET 1H according to Embodiment of the present disclosure. FIGS. 30 and 31 are cross-sectional views illustrating the method for manufacturing the vertical MOSFET 1H according to Embodiment of the present disclosure in the order of steps. As illustrated in step ST51 of FIG. 30, the manufacturing equipment forms a mask M51 that exposes the top of the source forming region 18' and covers the tops of the other regions on the front surface 10a of the GaN substrate 10, and ion implants Si as a donor element into the GaN substrate 10 formed with the mask M51. In this ion implantation step, the dosage of Si is set so that the Si concentration in the source forming region 18' is, for example, 1E+19 cm$^{-3}$. The mask M51 is, for example, a resist pattern. After the ion implantation, the manufacturing equipment removes the mask M51 from the GaN substrate 10.

Next, as illustrated in step ST52 of FIG. 30, the manufacturing equipment forms a mask M52 that exposes the top of a region where the trench H is to be formed and covers the tops of the other regions on the front surface 10a of the GaN substrate 10. Then, the manufacturing equipment etches each portion that is on the front surface 10a side of the GaN substrate 10 and that is exposed out of the mask M52 to form the trench H on the front surface 10a side of the GaN substrate The manufacturing equipment forms the trench H more deeply than the first well region 131.

Next, as illustrated in step ST53 of FIG. 31, the manufacturing equipment uses the mask M52 as it is to ion implant Mg as an acceptor element into the second well forming region 132' on the side surfaces of the trench H. In this ion implantation step, the dosage of Mg is set so that the Mg concentration in the second well region 132 is, for example, 3E+18 cm$^{-3}$. The mask M52 is, for example, a resist pattern. After the ion implantation, the manufacturing equipment removes the mask M52 from the GaN substrate 10.

Next, the manufacturing equipment forms a protective film (not illustrated) on the front surface 10a of the GaN substrate 10, and performs heat treatment on the GaN substrate 10 formed with the protective film. The heat treatment activates the Si and Mg ion implanted into the GaN substrate to form the N$^+$-type source region 18 and the P$^+$-type second well region 132. After the heat treatment, the manufacturing equipment removes the protective film from the GaN substrate 10.

Next, as illustrated in step ST54 of FIG. 31, the manufacturing equipment forms the gate insulating film 21 on the front surface 10a of the GaN substrate 10, and covers the side surfaces and a bottom surface of the trench H. For example, the manufacturing equipment forms an SiO$_2$ film as the gate insulating film 21 to a thickness of 100 nm by a plasma CVD process. Then, the manufacturing equipment forms the gate electrode 23 and the source electrode 25 on the front surface 10a side of the GaN substrate 10. Additionally, the manufacturing equipment forms the drain electrode 27 on the back surface 10b of the GaN substrate 10. The vertical MOSFET 1H according to Embodiment 5 is completed through such steps.

Effects of Embodiment 5

Embodiment 5 achieves the same effects as those of Embodiment 1. The vertical MOSFET 1H according to Embodiment 5 can reduce hole traps at the interface between the P$^+$-type second well region 132 and the gate insulating film 21, enabling suppression of channel mobility reduction and variation in the threshold voltage Vth due to the hole traps. In addition, since a channel is formed in the layered structure of the P$^+$-type second well region 132 and the P-type first well region 131, the threshold voltage Vth can be easily controlled to a desired value.

Additionally, the vertical MOSFET 1H having the trench structure enables shortened cell pitch compared to those having the planar gate structure, such as the vertical MOSFET 1. This can facilitate a dense arrangement of vertical MOSFETs 1H, enabling reduced on-resistance in the GaN semiconductor device 100 (see FIG. 1).

Embodiment 6

In embodiments of the present disclosure, the P$^+$-type second well region 132 may be used for a breakdown voltage structure portion of the edge termination region 130 (see FIG. 1). In this case, the P$^+$-type second well region 132 included in any one of the above-described vertical MOSFETS 1 to 1H and the P$^+$-type second well region 132 included in the edge termination region 130 may be formed simultaneously in the same step. Hereinafter, Configuration Examples 1 to 3 of the edge termination region 130 are described.

Configuration Example 1

Figure 32:
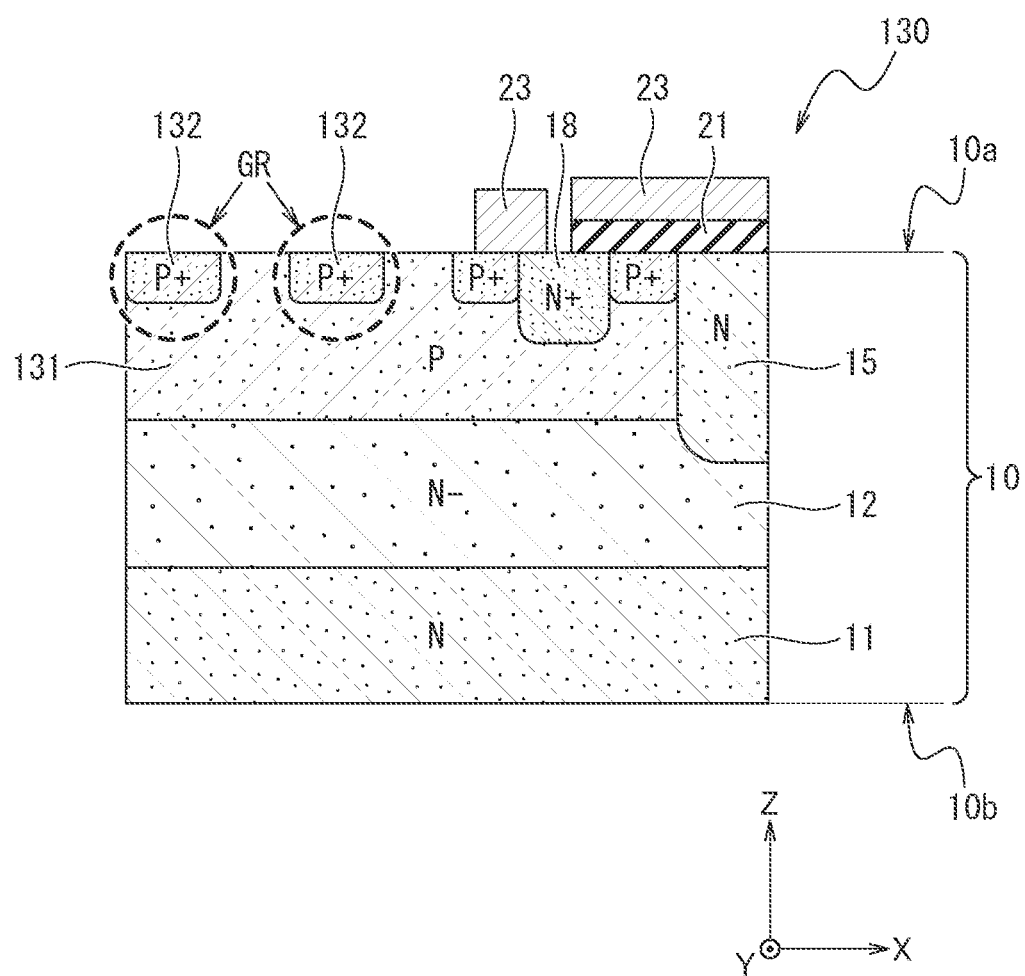
FIG. 32 is a cross-sectional view illustrating a configuration example 1 of a breakdown voltage structure portion of an edge termination region according to Embodiment 6 of the present disclosure.

FIG. 32 is a cross-sectional view illustrating Configuration Example 1 of the breakdown voltage structure portion of the edge termination region 130 according to Embodiment 6 of the present disclosure. As illustrated in FIG. 32, the edge termination region 130 includes, as the breakdown voltage structure portion, a guard ring structure GR surrounding the active region 110 (see FIG. 1) in a ring shape. The guard ring structure GR is configured by, for example, the P$^+$-type second well region 132. The breakdown voltage structure portion has a structure in which the guard ring structure GR (i.e., the second well region 132 surrounding the active region 110 in the ring shape) is arranged at constant intervals from an end portion of the vertical MOSFET toward an outer peripheral side of the GaN substrate 10.

Since the GaN semiconductor device 100 (see FIG. 1) includes the guard ring structure GR, a depletion layer in a gate-off state easily spreads to an outer peripheral side end portion of the GaN substrate 10. As a result, breakdown voltage of the vertical MOSFET can be increased compared to cases without the breakdown voltage structure GR.

Additionally, although FIG. 32 illustrates a case where the guard ring structure GR surrounding the active region 110 in the ring shape is provided in plurality, embodiments of the present disclosure are not limited thereto. A single guide ring structure GR surrounding the active region 110 in a ring shape may be provided instead of a plurality thereof.

Figure 33:
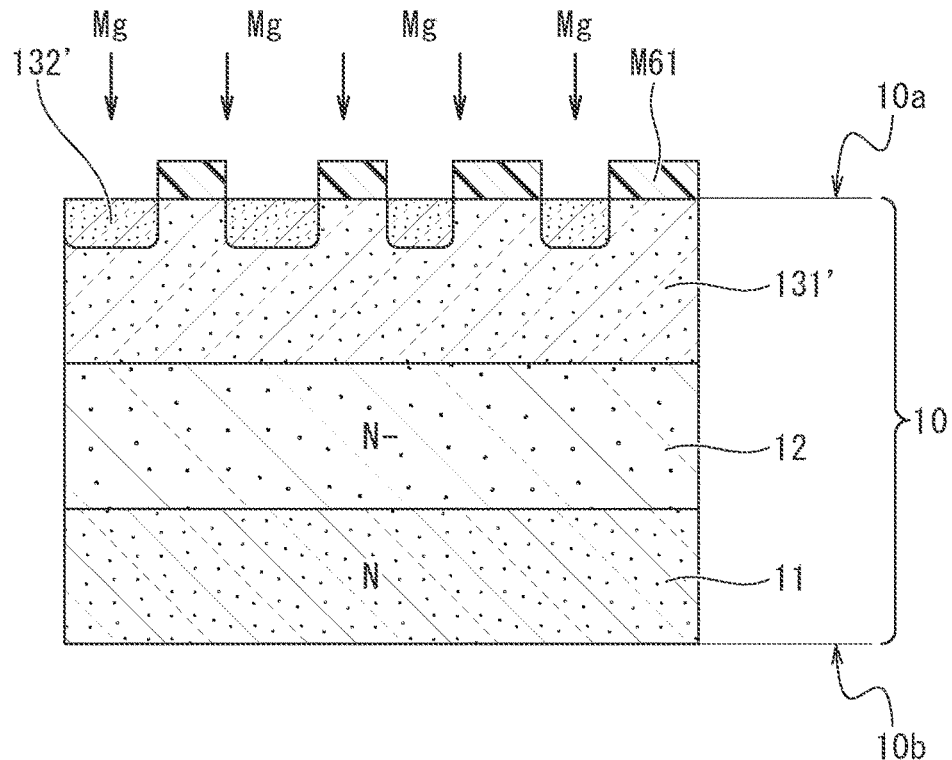
FIG. 33 is a cross-sectional view illustrating a method for manufacturing the breakdown voltage structure portion illustrated in FIG. 32.

Next, a method for manufacturing the breakdown voltage structure portion illustrated in FIG. 32 is described. FIG. 33 is a cross-sectional view illustrating the method for manufacturing the breakdown voltage structure portion illustrated in FIG. 32. As illustrated in FIG. 33, in the edge termination region 130, the manufacturing equipment forms a mask M61 that exposes the top of each second well forming region 132' and covers the tops of the other regions on the front surface 10a of the GaN substrate 10, and ion implants Mg as an acceptor element into the GaN substrate 10 formed with the mask M61. The mask M61 is, for example, a resist pattern. After the ion implantation, the manufacturing equipment removes the mask M61 from the GaN substrate 10.

After that, the manufacturing equipment forms a protective film (not illustrated) on the front surface 10a of the GaN substrate 10, and performs heat treatment on the GaN substrate 10. The heat treatment is, for example, rapid heat treatment. The heat treatment activates the Mg ion implanted into the GaN substrate 10 to form the P$^+$-type second well region 132 (see FIG. 32) in the GaN substrate 10. The breakdown voltage structure portion illustrated in FIG. 32 is completed through such steps.

In Configuration Example 1, the mask M61 maybe used for the mask M3 illustrated in FIG. 5 of Embodiment 1, the mask M4 illustrated in FIG. 11 of Modification 1 of Embodiment 1, the mask M31 illustrated in FIG. 18 of Embodiment 3, and the mask M44 illustrated in FIG. 28 of Embodiment 4. By doing this, the above respective embodiments or the modifications thereof allow the second well region 132 of the active region 110 and the second well region 132 of the edge termination region 130 to be formed simultaneously in the same step. This can suppress an increase in the number of steps.

Configuration Example 2

Figure 34:
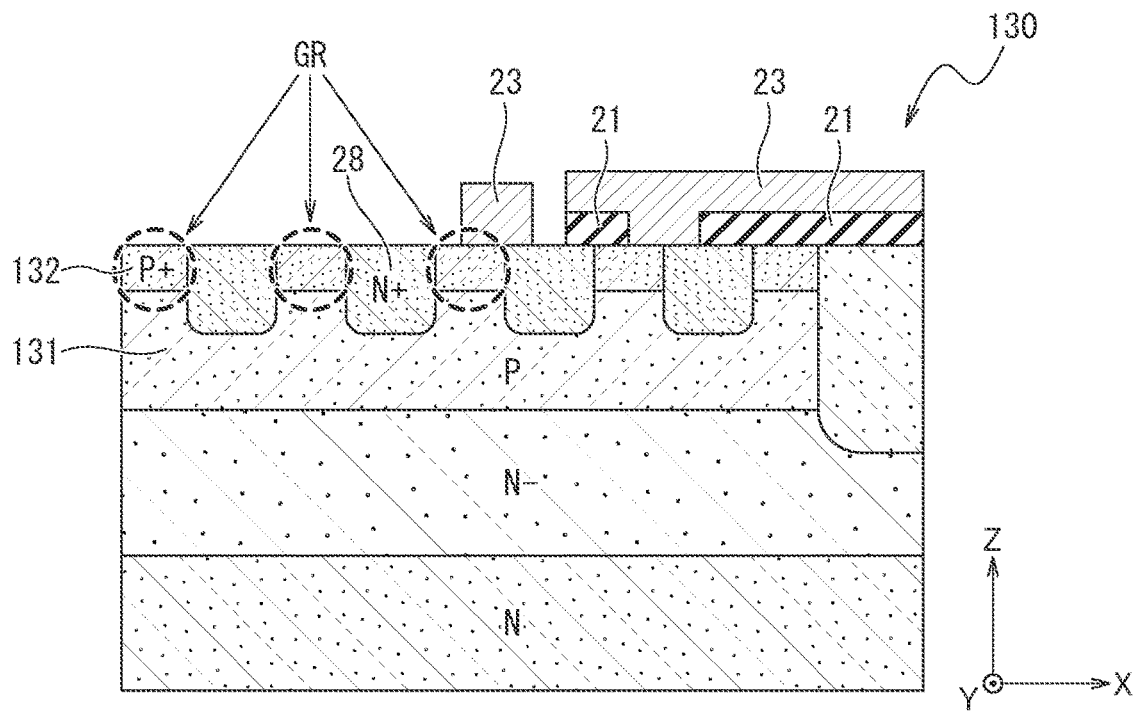
FIG. 34 is a cross-sectional view illustrating a configuration example 2 of the breakdown voltage structure portion of the edge termination region according to Embodiment 6 of the present disclosure.

FIG. 34 is a cross-sectional view illustrating Configuration Example 2 of the breakdown voltage structure portion of the edge termination region 130 according to Embodiment 6 of the present disclosure. As illustrated in FIG. 34, the edge termination region 130 includes a plurality of guard ring structures GR spaced apart from each other and an N$^+$-type region 28 arranged between one of the adjacent guard ring structures GR and the other one thereof, as the breakdown voltage structure portion. The guard ring structures GR are each configured by the P$^+$-type second well region 132 and adjacent to the N$^+$-type region 28.

As a result, a depletion layer in a gate-off state is more likely to spread further to the outer peripheral side end portion of the GaN substrate 10. The GaN semiconductor device 100 can further increase the breakdown voltage of the vertical MOSFET.

Figure 35:
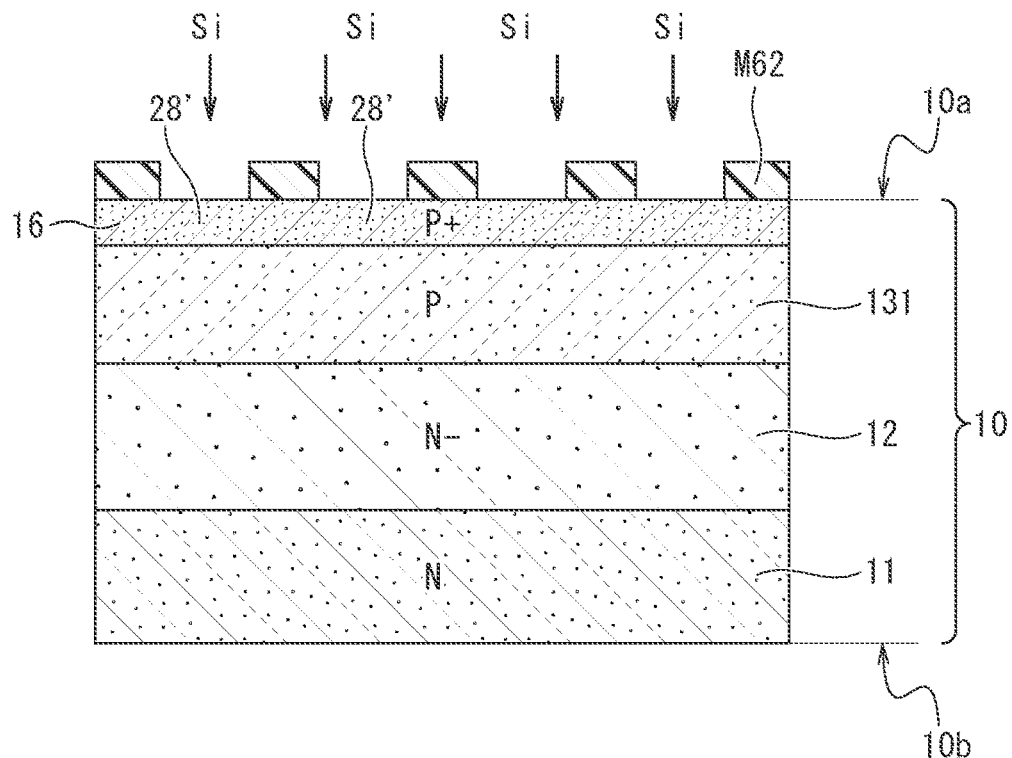
FIG. 35 is a cross-sectional view illustrating a method for manufacturing the breakdown voltage structure portion illustrated in FIG. 34.

Next, a method for manufacturing the breakdown voltage structure portion illustrated in FIG. 34 is described. FIG. is a cross-sectional view illustrating the method for manufacturing the breakdown voltage structure portion illustrated in FIG. 34. In FIG. 35, the P-type first well region 131 and the P$^+$-type GaN layer 16 are already formed on the GaN substrate 10 by an epitaxial growth process. As illustrated in FIG. 35, in the edge termination region 130, the manufacturing equipment forms a mask M62 that exposes the top of each region where the N$^+$-type region 28 is to be formed (hereinafter referred to as N$^+$-type forming region 28') and covers the tops of the other regions on the front surface 10a of the GaN substrate 10, and ion implants Si as a donor element into the GaN substrate 10 formed with the mask M62. The mask M62 is, for example, a resist pattern. After the ion implantation, the manufacturing equipment removes the mask M62 from the GaN substrate 10.

After that, the manufacturing equipment forms a protective film (not illustrated) on the front surface 10a of the GaN substrate 10, and performs heat treatment on the GaN substrate 10. The heat treatment is, for example, rapid heat treatment. The heat treatment activates the Si ion implanted into the GaN substrate 10 to form the N$^+$-type regions 28 (see FIG. 34) on the GaN substrate 10. Additionally, in the P$^+$-type GaN layer 16 formed by the epitaxial growth process, a region sandwiched by the N$^+$-type regions 28 is the second well region 132. The breakdown voltage structure portion illustrated in FIG. 34 is completed through such steps.

In Configuration Example 2, the mask M62 may be used for the mask M11 illustrated in FIG. 16 of Embodiment 2. This allows the source region 18 of the active region 110 and the N$^+$-type region 28 of the edge termination region 130 to be simultaneously formed in the same step in Embodiment 2 described above, so that an increase in the number of steps can be suppressed.

Configuration Example 3

Figure 36:
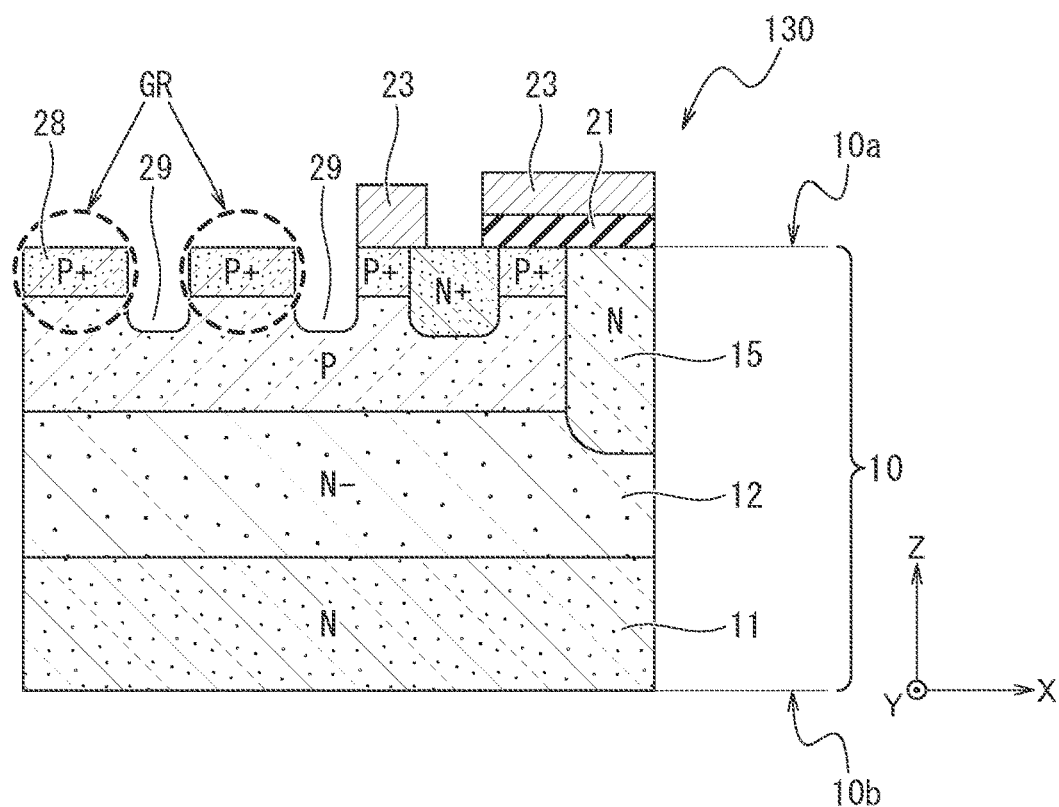
FIG. 36 is a cross-sectional view illustrating a configuration example 3 of the breakdown voltage structure portion of the edge termination region according to Embodiment 6 of the present disclosure.

FIG. 36 is a cross-sectional view illustrating Configuration Example 3 of the breakdown voltage structure portion of the edge termination region 130 according to Embodiment 6 of the present disclosure. As illustrated in FIG. 36, the edge termination region 130 includes a plurality of guard ring structures GR spaced apart from each other and a trench 29 arranged between one of the adjacent guard ring structures GR and the other one thereof, as the breakdown voltage structure portion. The guard ring structures GR are each configured by the P$^+$-type second well region 132 and adjacent to the trench 29. The trench 29 is embedded with an interlayer insulating film (not illustrated). Even with such a configuration, the GaN semiconductor device 100 can increase breakdown voltage of the vertical MOSFET.

Figure 37:
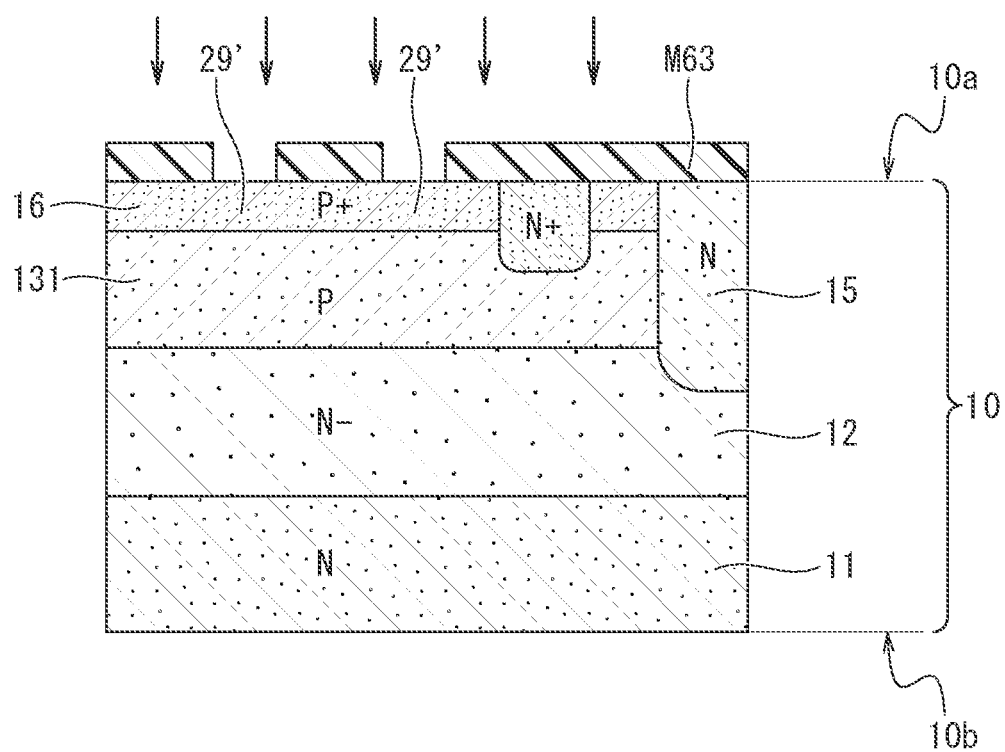
FIG. 37 is a cross-sectional view illustrating a method for manufacturing the breakdown voltage structure portion illustrated in FIG. 36.

Next, a method for manufacturing the breakdown voltage structure portion illustrated in FIG. 36 is described. FIG. 37 is a cross-sectional view illustrating the method for manufacturing the breakdown voltage structure portion illustrated in FIG. 36. In FIG. 37, the P$^+$-type second well region 132 and the N$^+$-type source region 18 are already formed on the GaN substrate 10. As illustrated in FIG. 37, in the edge termination region 130, the manufacturing equipment forms a mask M63 that exposes the top of each region where the trench 29 is to be formed (hereinafter referred to as trench forming region 29') and covers the tops of the other regions on the front surface 10a of the GaN substrate 10. Then, the manufacturing equipment performs dry etching on the front surface 10a side of the GaN substrate 10 formed with the mask M63 to form the trench 29 (see FIG. 36). The mask M63 is, for example, a resist pattern. After the ion implantation, the manufacturing equipment removes the mask M63 from the GaN substrate 10. The breakdown voltage structure portion illustrated in FIG. 36 is completed through such steps.

<Suitable Range of Na×t>

Figure 38:
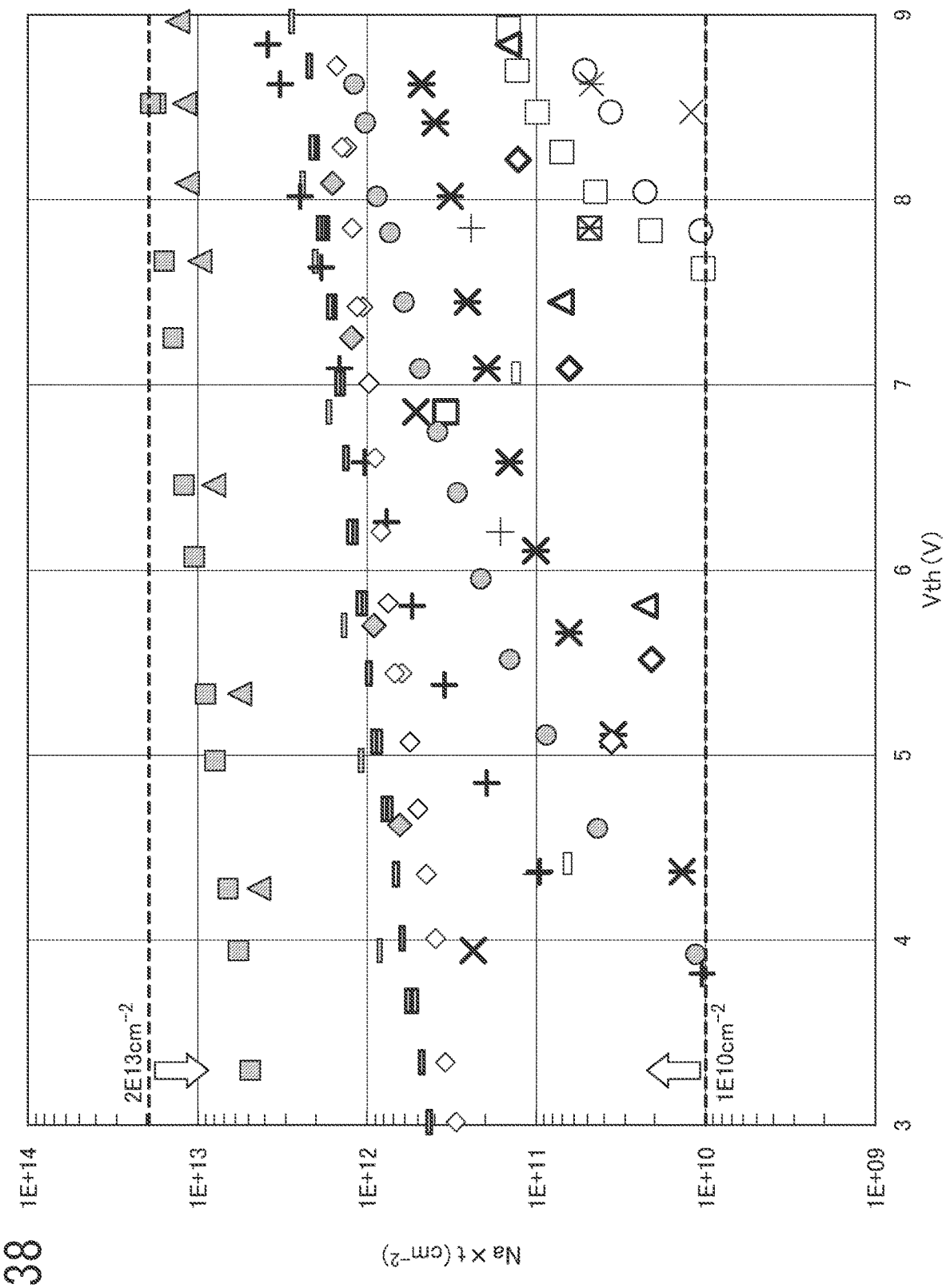
FIG. 38 is a graph illustrating a suitable range with respect to Na×t of a second well region according to each embodiment of the present disclosure.

FIG. 38 is a graph illustrating a suitable range for a product (Na×t) of an effective acceptor concentration Na and the thickness t of the second well region 132 according to each embodiment of the present disclosure. The vertical axis of FIG. 38 represents the product (Na×t) of Na and t, and the horizontal axis thereof represents the effective acceptor concentration Na of the second well region 132. The effective acceptor concentration Na of the second well region 132 is an effective concentration when an acceptor concentration of the first well region 131 and an acceptor concentration (Na') of the second well region 132 are combined together.

For example, assume a case where an acceptor element is ion implanted into a partial region of the first well region 131 (or the first well forming region 131') to form the second well region 132. In this case, the effective acceptor concentration Na of the second well region 132 has a value obtained by combining an acceptor concentration introduced when forming the first well region 131 with an acceptor concentration Na' introduced when forming the second well region 132.

The effective acceptor concentration Na of the second well region 132 is, for example, Mg concentration (cm$^{-3}$). The thickness t of the second well region 132 is a thickness in the normal direction of the interface between the well region 13 and the gate insulating film 21. The normal direction is, for example, the Z-axis direction in FIGS. 2, 10, 13, 17, 20, 21, 23, and 25, and the X-axis direction in FIG. 29.

Additionally, the graph of FIG. 38 was created based on calculations made by the present inventor. Specifically, parameters assumed in the calculations are as follows:
(a) Fixed Parameters
   acceptor level: 200 mV
   donor concentration: 1E+16 cm$^{-3}$
   acceptor concentration of first well region 131: 1E+17 cm$^{-3}$
(b) Variable Parameters
   film thickness dox of gate insulating film
   flat band voltage Vfb
   depletion layer width Wd
   acceptor concentration Na' of second well region 132

In addition, in the variable parameters, the dox was set to two patterns of 50 nm and 100 nm, the Vfb to two patterns of −10 V and 0 V, and the Wd to two patterns of a maximum value (max) and a minimum value (min) in a range in which the threshold voltage Vth of the vertical MOSFET was from 3 V to 9 V. The Wd was calculated using the effective acceptor concentration Na of the second well region 132, a semiconductor Fermi potential ϕB, and a semiconductor dielectric constant εs by the following formula (b1). The acceptor concentration Na' of the second well region 132 was set to three patterns of 5E+17 cm$^{-3}$, 3E+18 cm$^{-3}$, and 1E+19 cm$^{-3}$.

[Math. 1]

$$Wd = \sqrt{\frac{2\varepsilon_S}{qN_A}(2\phi_B)} \quad (b1)$$

Table 1 illustrates the variable parameters of each data item of FIG. 38.

TABLE 1

| $d_{ox}$ | $V_{fb}$ | $W_d$ | $N_a'$ | Symbol |
|---|---|---|---|---|
| 50 | −10 | max | 5E17 | |
| 50 | −10 | max | 3E18 | |
| 50 | −10 | max | 1E19 | |
| 50 | −10 | min | 5E17 | |
| 50 | −10 | min | 3E18 | |
| 50 | −10 | min | 1E19 | |
| 50 | 0 | max | 5E17 | |
| 50 | 0 | max | 3E18 | |
| 50 | 0 | max | 1E19 | |
| 50 | 0 | min | 5E17 | |
| 50 | 0 | min | 3E18 | |
| 50 | 0 | min | 1E19 | |
| 100 | −10 | max | 5E17 | |
| 100 | −10 | max | 3E18 | |
| 100 | −10 | max | 1E19 | |
| 100 | −10 | min | 5E17 | |
| 100 | −10 | min | 3E18 | |
| 100 | −10 | min | 1E19 | |
| 100 | 0 | max | 5E17 | |
| 100 | 0 | max | 3E18 | |
| 100 | 0 | min | 5E17 | |

The present inventor obtained FIG. 38 by varying the variable parameters and plotting on a graph the effective acceptor concentration Na of the second well region 132 at which the threshold voltage Vth was within the range of from 3V to 9V and the thickness t of the second well region 132. From FIG. 38, the Na×t range where the threshold voltage Vth is from 3 V to 9 V is as in Formula (1):

$$1E+10 \text{ cm}^{-2} < Na \times t < 2E+13 \text{ cm}^{-2} \quad (1)$$

Satisfying Formula (1) allows for obtaining of a GaN semiconductor device capable of reducing hole traps while maintaining the threshold voltage Vth of the vertical MOSFET within the range of from 3 V to 9 V.

Other Embodiments

Although the present disclosure has been described with reference to the embodiments and the modifications as above, it should not be understood that the statement and the drawings constituting a part of the disclosure are intended to limit the present disclosure. Various alternative embodiments and modifications will become apparent to those skilled in the art from this disclosure. Obviously, the present technology includes various embodiments and the like that are not described herein.

For example, although the above embodiments have been described with reference to the case where the GaN monocrystalline substrate 11, the drift region 12, and the source region 14 each have an N-type conductivity, and the well region 13 has a P-type conductivity, embodiments of the present disclosure are not limited thereto. In embodiments of the present disclosure, the GaN monocrystalline substrate 11, the drift region 12, and the source region 14 may each have a first conductivity (for example, P-type), and the well region 13 may have a second conductivity (for example, N-type). In this case, the first well region 131 may be of N-type, and the second well region 132 may be of $N^+$-type.

Thus, at least one of various omissions, substitutions, or modifications of the components may be made without departing from the spirit of the embodiments and modifications described above. Additionally, the effects described herein are merely illustrative and not limiting, and other effects may also be achieved.

In addition, the present disclosure can also be configured as follows:

(1) A nitride semiconductor device comprising:
a gallium nitride substrate; and
a vertical MOSFET provided on the gallium nitride substrate, the vertical MOSFET including:
an N-type drift region provided in the gallium nitride substrate;
a P-type well region provided in the drift region;
an N-type source region provided in the well region;
a gate insulating film provided on a surface of the well region; and
a gate electrode provided on the surface of the well region via the gate insulating film,
in which the well region includes a first well region and a second well region higher in acceptor element concentration than the first well region, the second well region being located between the first well region and the gate insulating film and being in contact with the source region.

(2) The nitride semiconductor device according to the above (1), in which the acceptor element concentration of the first well region is from $5E+16$ cm$^{-3}$ to below $5E+17$ cm$^{-3}$, and the acceptor element concentration of the second well region is from $5E+17$ cm$^{-3}$ to below $1E+19$ cm$^{-3}$.

(3) The nitride semiconductor device according to the above (1) or (2), in which in a normal direction of an interface between the second well region and the gate insulating film, the second well region has a thickness of from 1 nm to 90 nm.

(4) The nitride semiconductor device according to any one of the above (1) to (3), in which when an effective concentration of the acceptor element of the second well region is Na and the thickness of the second well region in the normal direction of the interface between the well region and the gate insulating film is t, the following formula is satisfied:

$$1E+10 \text{ cm}^{-2} < Na \times t < 2E+13 \text{ cm}^{-2}$$

(5) The nitride semiconductor device according to any one of the above (1) to (4), in which the gate insulating film is an Si oxide, an Al oxide, or a mixture of an Si oxide and an Al oxide.

(6) The nitride semiconductor device according to any one of the above (1) to (5), in which the gate insulating film has a film thickness of from 50 nm to 100 nm.

(7) The nitride semiconductor device according to any one of the above (1) to (6), in which the well region further includes a third well region higher in acceptor element concentration than the first well region on an opposite side of the second well region across the first well region.

(8) The nitride semiconductor device according to the above (7), in which the third well region has an acceptor element concentration of from $5E+17$ cm$^{-3}$ to below $1E+19$ cm$^{-3}$.

(9) The nitride semiconductor device according to any one of the above (1) to (8), in which the vertical MOSFET further includes an N-type JFET region sandwiched by the well region, the JFET region being higher in donor element concentration than the drift region.

(10) The nitride semiconductor device according to any one of the above (1) to (9), in which the vertical MOSFET includes a trench provided in the gallium nitride substrate, the second well region facing side surfaces of the trench, and the side surfaces being provided with the gate insulating film.

(11) The nitride semiconductor device according to any one of the above (1) to (10), further comprising a breakdown voltage structure portion provided in the gallium nitride substrate and formed around the vertical MOSFET, in which the breakdown voltage structure portion having a structure in which the second well region is arranged at constant intervals from an end portion of the vertical MOSFET toward an outer peripheral side of the gallium nitride substrate.

(12) The nitride semiconductor device according to any one of the above (1) to (11), in which in the normal direction of the interface between the well region and the gate insulating film, the second well region has a uniform acceptor element concentration.

(13) The nitride semiconductor device according to any one of the above (1) to (11), in which in the normal direction of the interface between the well region and the gate insulating film, the second well region has a peak region where the acceptor element concentration is at a maximum.

(14) A nitride semiconductor device comprising:
a gallium nitride substrate; and
a vertical MOSFET provided on the gallium nitride substrate, the vertical MOSFET including:
a drift region of a first conductivity type provided in the gallium nitride substrate;
a well region of a second conductivity type provided in the drift region;
a source region of the first conductivity type provided in the well region;
a gate insulating film provided on a surface of the well region; and
a gate electrode provided on the surface of the well region via the gate insulating film,
in which the well region includes a first well region and a second well region higher in second conductivity type element concentration than the first well region, the second well region being located between the first well region and the gate insulating film and being in contact with the source region.

REFERENCE SIGNS LIST 1, 1A, 1B, 1C, 1D, 1E, 1F, 1G, 1H: Vertical MOSFET
10: GaN substrate
10a: Front surface
10b: Back surface
11: GaN monocrystalline substrate
12: GaN layer (drift region)
13: Well region
14: Contact region
14': Contact forming region
15: JFET region
15': JFET forming region
16, 17: GaN layer (formed by epitaxial growth process)
18: Source region
18': Source forming region
21: Gate insulating film
23: Gate electrode 25: Source electrode
27: Drain electrode
28: N+-type region
28': N+-type forming region
29: Trench
29': Trench forming region
31: Protective film
100: GaN semiconductor device
110: Active region
112: Gate pad
114: Source pad
130: Edge termination region
131: First well region
131': First well forming region
132: Second well region
132': Second well forming region
133: Third well region
133': Third well forming region
301: Vertical MOSFET (according to Comparative Example)
H: Trench
M1, M2, M3, M4, M5, M6, M11, M12, M31, M32, M33, M41, M42, M43, M44, M51, M52, M61, M62, M63: Mask

The invention claimed is:

1. A nitride semiconductor device comprising:
a gallium nitride substrate; and
a vertical MOSFET provided on the gallium nitride substrate, the vertical MOSFET including:
an N-type drift region provided in the gallium nitride substrate;
a P-type well region provided in the drift region;
an N-type source region provided in the well region;
agate insulating film provided on a surface of the well region; and
a gate electrode provided on the surface of the well region via the gate insulating film,
wherein the well region includes a first well region and a second well region higher in acceptor element concentration than the first well region, the second well region being located between the first well region and the gate insulating film and being in contact with the source region.

2. The nitride semiconductor device according to claim 1, wherein the acceptor element concentration of the first well region is from $5E+16$ cm$^{-3}$ to below $5E+17$ cm$^{-3}$, and the acceptor element concentration of the second well region is from $5E+17$ cm$^{-3}$ to below $1E+19$ cm$^{-3}$.

3. The nitride semiconductor device according to claim 1, wherein in a normal direction of an interface between the second well region and the gate insulating film, the second well region has a thickness of from 1 nm to 90 nm.

4. The nitride semiconductor device according to claim 1, wherein when an effective concentration of the acceptor element of the second well region is Na and the thickness of the second well region in the normal direction of the interface between the well region and the gate insulating film is t, the following formula is satisfied:

$$1E+10 \text{ cm}^{-2} < Na \times t < 2E+13 \text{ cm}^{-2}.$$

5. The nitride semiconductor device according to claim 1, wherein the gate insulating film is an Si oxide, an Al oxide, or a mixture of an Si oxide and an Al oxide.

6. The nitride semiconductor device according to claim 1, wherein the gate insulating film has a film thickness of from 50 nm to 100 nm.

7. The nitride semiconductor device according to claim 1, wherein the well region further includes a third well region higher in acceptor element concentration than the first well region on an opposite side of the second well region across the first well region.

8. The nitride semiconductor device according to claim 7, wherein the third well region has an acceptor element concentration of from $5E+17$ cm$^{-3}$ to below $1E+19$ cm$^{-3}$.

9. The nitride semiconductor device according to claim 1, wherein the vertical MOSFET further includes an N-type JFET region sandwiched by the well region, the JFET region being higher in donor element concentration than the drift region.

10. The nitride semiconductor device according to claim 1, wherein the vertical MOSFET includes a trench provided in the gallium nitride substrate, the second well region facing side surfaces of the trench, and the side surfaces being provided with the gate insulating film.

11. The nitride semiconductor device according to claim 1, further comprising a breakdown voltage structure portion provided in the gallium nitride substrate and formed around the vertical MOSFET, wherein
the breakdown voltage structure portion has a structure in which the second well region is arranged at constant intervals from an end portion of the vertical MOSFET toward an outer peripheral side of the gallium nitride substrate.

12. The nitride semiconductor device according to claim 1, wherein in the normal direction of the interface between the well region and the gate insulating film, the second well region has a uniform acceptor element concentration.

13. The nitride semiconductor device according to claim 1, wherein in the normal direction of the interface between the well region and the gate insulating film, the second well region has a peak region where the acceptor element concentration is at a maximum.

14. A nitride semiconductor device comprising:
a gallium nitride substrate; and
a vertical MOSFET provided on the gallium nitride substrate, the vertical MOSFET including:
a drift region of a first conductivity type provided in the gallium nitride substrate;
a well region of a second conductivity type provided in the drift region;
a source region of the first conductivity type provided in the well region;
agate insulating film provided on a surface of the well region; and
a gate electrode provided on the surface of the well region via the gate insulating film,
wherein the well region includes a first well region and a second well region higher in second conductivity type element concentration than the first well region, the second well region being located between the first well region and the gate insulating film and being in contact with the source region.

* * * * *